US012677497B2

(12) United States Patent
Shimizu et al.

(10) Patent No.: US 12,677,497 B2
(45) Date of Patent: Jul. 7, 2026

(54) SEMICONDUCTOR DEVICE

(71) Applicant: SONY SEMICONDUCTOR SOLUTIONS CORPORATION, Kanagawa (JP)

(72) Inventors: Kan Shimizu, Kanagawa (JP); Katsumi Suemitsu, Yamagata (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 859 days.

(21) Appl. No.: 17/259,949

(22) PCT Filed: Jul. 24, 2019

(86) PCT No.: PCT/JP2019/028995
§ 371 (c)(1),
(2) Date: Jan. 13, 2021

(87) PCT Pub. No.: WO2020/022375
PCT Pub. Date: Jan. 30, 2020

(65) Prior Publication Data
US 2021/0273002 A1     Sep. 2, 2021

(30) Foreign Application Priority Data

Jul. 24, 2018     (JP) ................................. 2018-138609

(51) Int. Cl.
*H10F 39/00* (2025.01)
(52) U.S. Cl.
CPC ......... *H10F 39/809* (2025.01); *H10F 39/805* (2025.01); *H10F 39/811* (2025.01)

(58) Field of Classification Search
CPC .. H10F 39/811; H10F 39/805; H10F 39/8053; H10F 39/8063; H10F 39/809;
(Continued)

(56) References Cited

U.S. PATENT DOCUMENTS 5,891,799 A * 4/1999 Tsui .................... H01L 23/5226
257/E21.252
8,902,634 B2 12/2014 Iwayama
(Continued)

FOREIGN PATENT DOCUMENTS

| CN | 104425439 A | 3/2015 |
|---|---|---|
| CN | 104425496 A | 3/2015 |

(Continued)

OTHER PUBLICATIONS

International Search Report prepared by the Japan Patent Office on Oct. 2, 2019, for International Application No. PCT/JP2019/028995.

*Primary Examiner* — Yasser A Abdelaziez
(74) *Attorney, Agent, or Firm* — SHERIDAN ROSS P.C.

(57) ABSTRACT

There is provided a semiconductor device having a configuration suitable for higher integration. The semiconductor device includes: a first substrate having a first front surface; and a second substrate having a second front surface joined to the first front surface. The first substrate includes a first wiring layer including a first wiring line, and a first semiconductor layer that are stacked in order from a position close to the second substrate, and the second substrate includes a storage element layer including a storage element, and a second semiconductor layer that are stacked in order from a position close to the first substrate.

20 Claims, 21 Drawing Sheets

(58) Field of Classification Search
CPC . H10F 39/803; H01L 23/481; H01L 21/3205;
H01L 23/5226; H01L 25/167; H10B
61/22; H10W 20/0238; H10W 20/2134;
H10W 20/20; H10W 20/42; H10W 90/00;
H10P 14/40
See application file for complete search history.

(56) References Cited

U.S. PATENT DOCUMENTS

| | | | | |
|---|---|---|---|---|
| 2007/0045687 | A1* | 3/2007 | Kumura | H10B 53/30 |
| | | | | 257/295 |
| 2010/0238334 | A1* | 9/2010 | Takahashi | H04N 25/621 |
| | | | | 257/E31.097 |
| 2013/0015541 | A1 | 1/2013 | Kanaya | |
| 2014/0070162 | A1 | 3/2014 | Iwayama | |
| 2014/0312392 | A1 | 10/2014 | Takahashi | |
| 2015/0060967 | A1* | 3/2015 | Yokoyama | H01L 21/76898 |
| | | | | 257/295 |
| 2015/0270307 | A1* | 9/2015 | Umebayashi | H10F 39/8037 |
| | | | | 257/292 |
| 2017/0207158 | A1* | 7/2017 | Kang | H01L 24/17 |
| 2018/0025765 | A1 | 1/2018 | Yokoyama | |
| 2018/0240797 | A1 | 8/2018 | Yokoyama et al. | |
| 2019/0019813 | A1* | 1/2019 | Ren | H10D 86/60 |
| 2022/0199468 | A1* | 6/2022 | Jun | H10W 20/069 |

FOREIGN PATENT DOCUMENTS

| | | |
|---|---|---|
| CN | 106992162 A | 7/2017 |
| JP | 2011204829 A | 10/2011 |
| JP | 2013-021108 | 1/2013 |
| JP | 2013201343 A | 10/2013 |
| JP | 2014-056941 | 3/2014 |
| JP | 2015-065407 | 4/2015 |
| JP | 2016062901 A | 4/2016 |
| JP | 2017-130660 | 7/2017 |
| KR | 20170086924 A | 7/2017 |
| KR | 20180048613 A | 5/2018 |
| WO | WO 2017/038403 | 3/2017 |

* cited by examiner

SEMICONDUCTOR DEVICE

CROSS REFERENCE TO RELATED APPLICATIONS

This application is a national stage application under 35 U.S.C. 371 and claims the benefit of PCT Application No. PCT/JP2019/028995 having an international filing date of 24 Jul. 2019, which designated the United States, which PCT application claimed the benefit of Japanese Patent Application No. 2018-138609, filed 24 Jul. 2018, the entire disclosures of each of which are incorporated herein by reference.

TECHNICAL FIELD

The present disclosure relates to a semiconductor device including a storage element.

BACKGROUND ART

In semiconductor integrated circuits including CMOS (Complementary Metal Oxide Semiconductor) transistors, higher integration and higher operation speed have been considered. Recently, in terms of low power consumption, conversion of volatile memories to nonvolatile memories has been considered, and, for example, MRAMs (Magnetoresistive Random Access Memories) have been developed (for example, refer to PTL 1).

CITATION LIST

Patent Literature

PTL 1: Japanese Unexamined Patent Application Publication No. 2015-65407

SUMMARY OF THE INVENTION

Incidentally, in a semiconductor device including such a semiconductor integrated circuit, further higher integration is desired. It is therefore desirable to provide a semiconductor device having a configuration suitable for higher integration.

A semiconductor device as an embodiment of the present disclosure includes: a first substrate having a first front surface; and a second substrate having a second front surface joined to the first front surface. The first substrate includes a first wiring layer including a first wiring line, and a first semiconductor layer that are stacked in order from a position close to the second substrate. The second substrate includes a storage element layer including a storage element, and a second semiconductor layer that are stacked in order from a position close to the first substrate.

In the semiconductor device as the embodiment of the present disclosure, a distance between the first wiring layer in the first substrate and the storage element in the second substrate is close.

According to the semiconductor device as the embodiment of the present disclosure, the semiconductor device is suitable for higher integration. It is to be noted that the effects of the present disclosure are not limited thereto, and may be any effect described below.

MODES FOR CARRYING OUT THE INVENTION

Embodiments of the present disclosure are described in detail below with reference to the drawings. It is to be noted that description is given in the following order.

1. First Embodiment (An example of an imaging device having a two-layer configuration)
   1-1. Basic Embodiment
   1-2. First Modification Example
   1-3. Second Modification Example
   1-4. Third Modification Example
   1-5. Fourth Modification Example
2. Second Embodiment (An example of an imaging device having a three-layer configuration)
   2-1. Basic Embodiment
   2-2. Fifth Modification Example
   2-3. Sixth Modification Example
   2-4. Seventh Modification Example
   2-5. Eighth Modification Example
3. Third Embodiment (An example of application to an electronic apparatus)
4. Example of Practical Application to Mobile Body
5. Other Modification Examples

1. First Embodiment

1-1. Basic Embodiment

[Configuration of Imaging Device 1]

Figure 1:
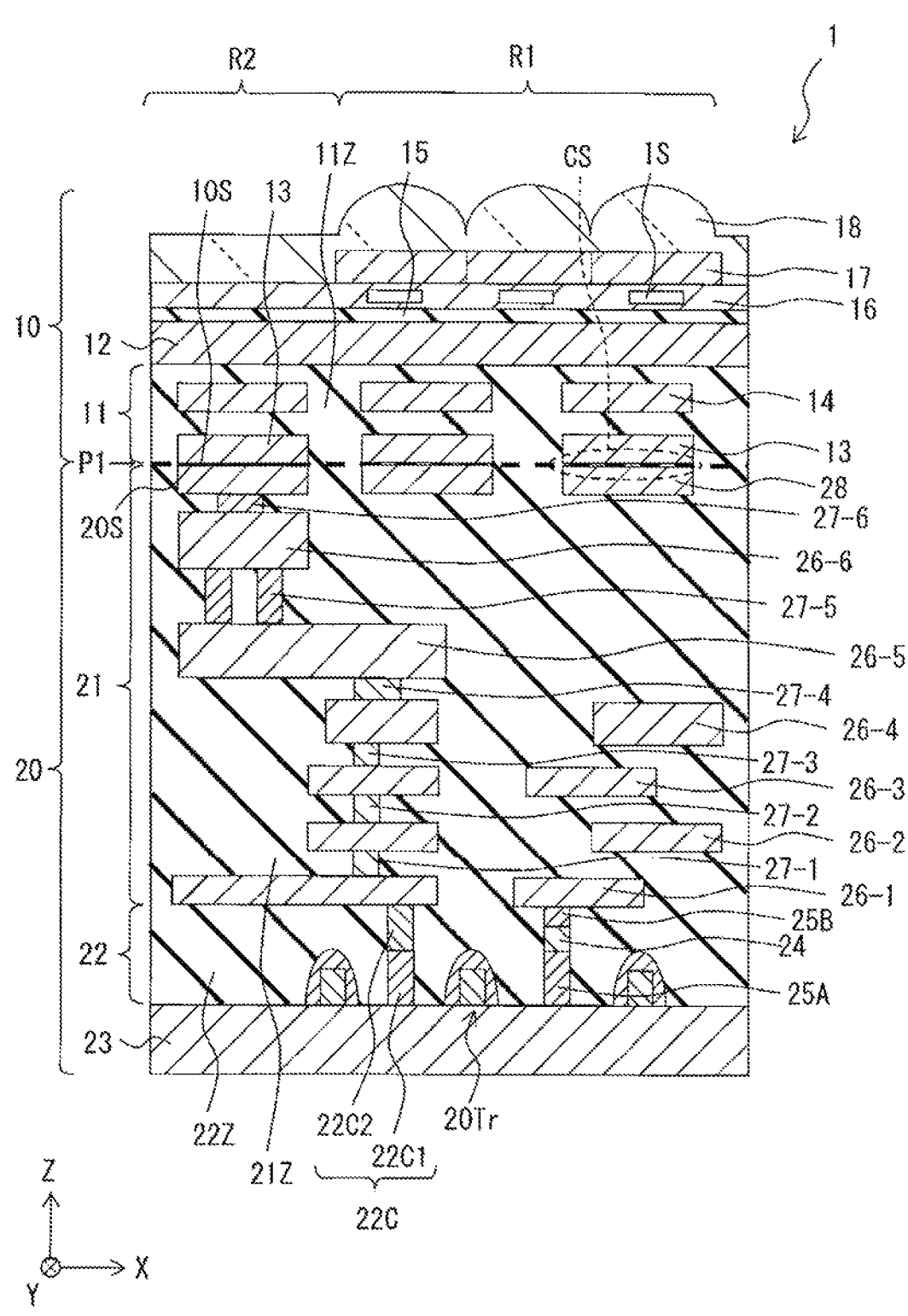
FIG. 1 is a cross-sectional view of a configuration example of an imaging device according to a first embodiment of the present disclosure.

FIG. 1 is a schematic cross-sectional view of an entire configuration example of an imaging device 1 as a semiconductor device according to a first embodiment of the present disclosure.

As illustrated in FIG. 1, the imaging device 1 has a two-layer configuration in which a sensor substrate 10 as a first substrate having a front surface 10S and a circuit substrate 20 as a second substrate having a front surface 20S are stacked. In the imaging device 1, the front surface 10S and the front surface 20S are joined together at a position P1. In the present embodiment, a stacking direction of the sensor substrate 10 and the circuit substrate 20 is defined as a Z-axis direction, and a plane where each of the sensor substrate 10 and the circuit substrate 20 spreads is defined as an XY plane. The imaging device 1 is a so-called backside illumination type image sensor device.

(Sensor Substrate 10)

The sensor substrate 10 includes a wiring layer including a first wiring line and a semiconductor layer 12 that are stacked in order from a position close to the circuit substrate 20. The wiring layer 11 of the sensor substrate 10 includes an electrode 13 and a wiring line 14. The electrode 13 and the wiring line 14 are formed including, for example, a highly electrically conductive nonmagnetic material such as Cu (copper), and are embedded in an insulating layer 11Z including $SiO_2$ or the like, for example. However, a portion of the electrode 13 is exposed to the front surface 10S. Examples of the semiconductor layer 12 include a Si (silicon) substrate.

The sensor substrate 10 further includes an insulating layer 15, a semiconductor layer 16, a color filter layer 17, and a microlens layer 18 that are stacked in order on a side opposite to the wiring layer 11 as viewed from the semiconductor layer 12. In the semiconductor layer 16, for example, a solid-state imaging element IS using a CMOS is embedded. The insulating layer 15 also includes $SiO_2$ or the like, for example.

(Circuit Substrate 20)

The circuit substrate 20 includes a wiring layer 21, a storage element layer 22, and a semiconductor layer 23 that are stacked in order from a position close to the sensor substrate 10.

In the wiring layer 21, wiring lines 26-1 to 26-6, vias 27-1 to 27-6, and an electrode 28 are embedded in an insulating layer 21Z including $SiO_2$ or the like, for example. However, a portion of the electrode 28 is exposed to the front surface 20S, and is joined to the electrode 13 exposed to the front surface 10S to form a joint section CS. It is to be noted that the sensor substrate 10 includes a pixel region R1 in which a plurality of solid-state imaging elements IS are arranged, and a peripheral region R2 surrounding the pixel region R1, and it is sufficient if the joint section CS is formed at a position overlapping the pixel region R1 in the stacking direction (the Z-axis direction) of the sensor substrate 10 and the circuit substrate 20. However, the joint section CS may be formed in the peripheral region R2. In addition, the electrode 28, the wiring lines 26-1 to 26-6, and the vias 27-1 to 27-6 each are formed using a highly electrically conductive nonmagnetic material such as Cu (cupper), for example. The electrode 13 and the electrode 28 forms the joint section CS by Cu—Cu bonding in which Cu included in the electrode 13 and Cu included in the electrode 28 are directly bonded together, for example. Electrical conduction between the electrode 13 and the electrode 28 is secured by the Cu—Cu bonding. In addition, the wiring lines 26-1 to 26-6 and the vias 27-1 to 27-6 are alternately stacked in order from the storage element layer 22 side. It is to be noted that in the following description, there are cases where the wiring lines 26-1 to 26-6 are comprehensively referred to as "wiring lines 26" and the vias 27-1 to 27-6 are comprehensively referred to as "vias 27".

The storage element layer 22 includes a transistor 20Tr, a storage element 24, a contact layer 25A, and a contact layer 25B. The transistor 20Tr is provided between the storage element 24 and the semiconductor layer 23, for example, near a front surface of the semiconductor layer 23. The contact layer 25A includes an electrically conductive layer coupled to the storage element 24 and one of a source electrode and a drain electrode in the transistor 20Tr. In addition, the contact layer 25B includes an electrically conductive layer coupled to the storage element 24 and the wiring line 26-1. Furthermore, the other of the source electrode and the drain electrode in the transistor 20Tr is coupled to another wiring line 26-1 through a contact layer 22C1 and a contact layer 22C2. The transistor 20Tr, the storage element 24, the contact layer 25A, the contact layer 25B, and the like are embedded in an insulating layer 22Z.

[Detailed Configuration Near Storage Element 24]

Figure 2:
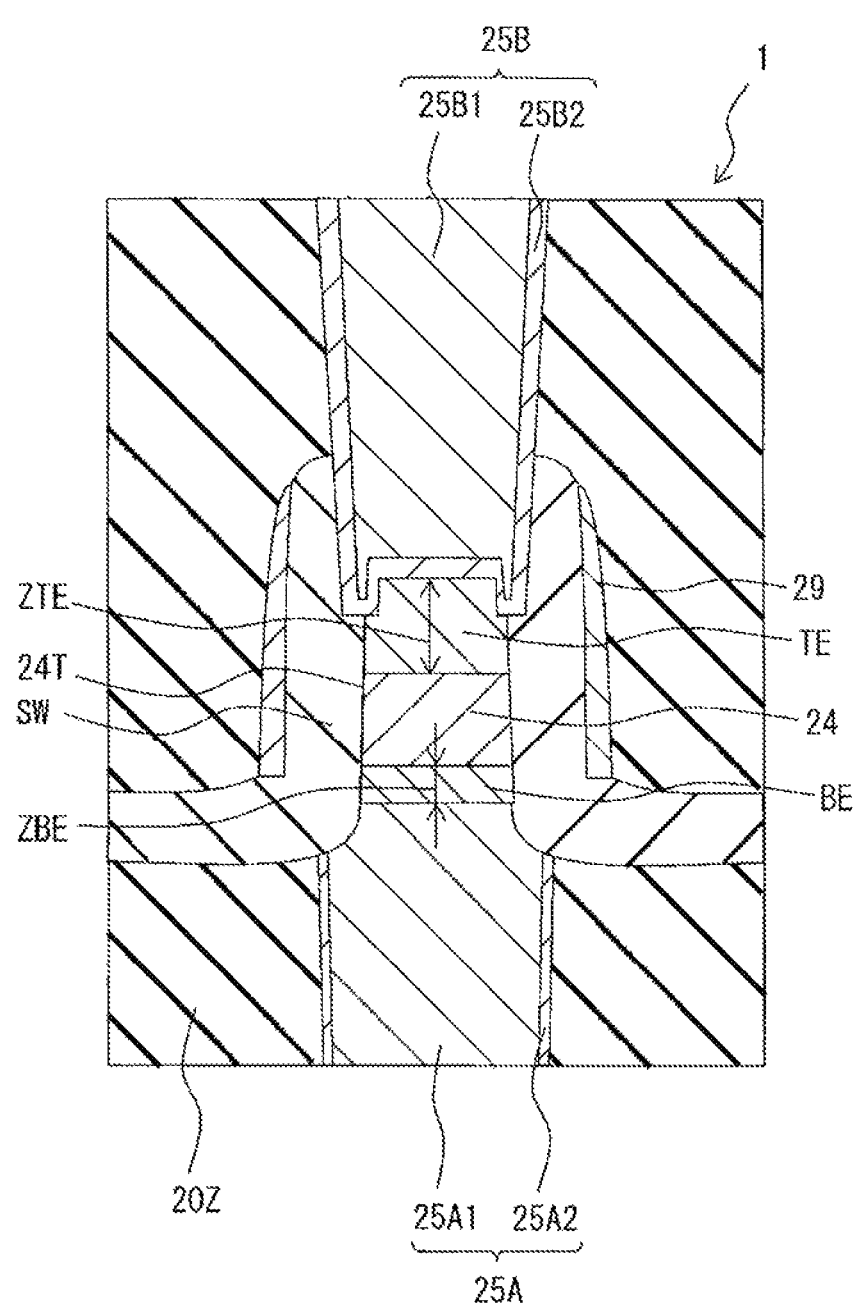
FIG. 2 is an enlarged cross-sectional view of a main-part configuration example of the imaging device illustrated in FIG. 1.
Figure 2:
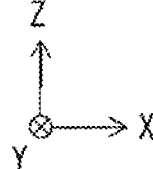

Next, description is given of a configuration near the storage element 24 with reference to FIG. 2. FIG. 2 is an enlarged cross-sectional view of enlarged details near the storage element 24 illustrated in FIG. 1.

As illustrated in FIG. 2, an insulating side wall section SW and a hydrogen block layer 29 that prevents transmission of $H_2$ (a hydrogen gas) are provided near the storage element 24 in the circuit substrate 20. The side wall section SW covers an end surface 24T of the storage element 24 to surround the end surface 24T in the XY plane. A material of the side wall section SW includes an electrically conductive material containing a Group 4 element of Ti (titanium), Zr (zirconium), or Hf (hafnium), an electrically conductive material containing a Group 5 element of V (vanadium), Nb (niobium), or Ta (tantalum), a nitride of the Group 4 element, or a nitride of the Group 5 element. It is also possible to use an electrically non-conductive material such as $Al_2O_3$ (alumina), $ZnO_2$ (zinc peroxide), or SiN (silicon nitride) as the material of the side wall section SW. The hydrogen block layer 29 further covers at least a portion of an outer surface of the side wall section SW. The hydrogen block layer 29 includes, for example, a thin layer formed by a sputtering method, for example, and it is sufficient if the hydrogen block layer 29 covers the outer surface of the side wall section SW to surround the outer surface in the XY plane. The hydrogen block layer 29 includes, for example, a metal material, such as Ti (titanium), that stores hydrogen, and it is sufficient if the hydrogen block layer 29 blocks transmission of $O_2$ (an oxygen gas), $H_2O$ (water), and a hydrogen radical in addition to the hydrogen gas. All the hydrogen gas, the oxygen gas, water, and the hydrogen radical are deterioration-causing materials having a possibility of causing deterioration in performance of the storage element 24. Such deterioration-causing materials may be generated in a manufacturing process of the imaging device 1, specifically, when joining the front surface 10S and the front surface 20S together, and when forming the wiring lines 26, the vias 27, and the like in the wiring layer 21. The deterioration-causing materials described above are less likely to reach the storage element 24 by the presence of the hydrogen block layer 29.

Examples of the storage element 24 include a stacked body including a plurality of magnetic layers stacked in the Z-axis direction, for example, such as a magnetic tunnel junction (MTJ) element, for example, and the storage element 24 is supplied with a sense current in the Z-axis direction to perform writing of information and reading of the information. The storage element 24 is sandwiched between the contract layer 25A and the contact layer 25B in the stacking direction (the Z-axis direction). The circuit substrate 20 further includes a lower electrode BE as a first terminal provided between the contact layer 25A and the storage element 24, and an upper electrode TE as a second terminal provided between the storage element 24 and the contact layer 25B. The lower electrode BE and the upper electrode TE may include, for example, a highly electrically conductive material including one or more of Ti, TiN (titanium nitride), Ta (tantalum), TaN (tantalum nitride), W (tungsten), Cu, and Al (aluminum). The lower electrode BE and the upper electrode TE may have a stacked configuration in which a plurality of electrically conductive layers is stacked, without limiting to a single-layer configuration. Furthermore, it is desirable that a thickness ZTE of the upper electrode TE be larger than a thickness ZBE of the lower electrode BE. A reason for this is that the deterioration-causing materials described above are further less likely to reach the storage element 24.

The contact layer 25A has, for example, a two-layer configuration including a core 25A1 and a barrier layer 25A2 covering surroundings of the core 25A1. Similarly, the contact layer 25B has a two-layer configuration including a core 25B1 and a barrier layer 25B2 covering surroundings of the core 25B1. The cores 25A1 and 25B1 include, for example, a material mainly including a highly electrically conductive material such as Cu, W, or Al. The barrier layers 25A2 and 25B2 include a material mainly including elemental Ti, elemental Ta (tantalum), or an alloy including at least one of Ti or Ta.

A preferable example of the storage element 24 is a spin transfer torque-magnetic tunnel junction type storage element (STT-MTJ; Spin Transfer Torque-Magnetic Tunnel Junctions) that stores information by reversing, by spin transfer, the direction of magnetization of a storage layer to be described later. The STT-MTJ is capable of high-speed writing and reading; therefore, the STT-MTJ is a promising nonvolatile memory as an alternative to volatile memories. The storage element 24 has, for example, a stacked configuration in which a underlayer, a magnetization fixed layer, an insulating layer, a storage layer, and a cap layer are stacked in order from a side close to the contact layer 25A. In the storage element 24, information is stored by changing the direction of magnetization of the storage layer having uniaxial anisotropy. Information "0" or "1" is determined by a relative angle (parallel or antiparallel) between the magnetization of the storage layer and magnetization of the magnetization fixed layer.

The underlayer and the cap layer in the storage element 24 each include, for example, a metal film including Ta, Ru, or the like, or a laminated film thereof.

The magnetization fixed layer in the storage element 24 is a reference layer as a reference of stored information (the direction of magnetization) of the storage layer. The magnetization fixed layer includes a ferromagnetic material having a magnetic moment in which the direction of the magnetization is fixed to a direction perpendicular to a film surface. The magnetization fixed layer includes, for example, Co—Fe—B.

It is not desirable to change the direction of the magnetization of the magnetization fixed layer by writing or reading, but the direction of the magnetization of the magnetization fixed layer is not necessarily fixed to a specific direction. A reason for this is that it is sufficient if the direction of the magnetization of the magnetization fixed layer is less likely to be moved than the direction of the magnetization of the storage layer. For example, it is sufficient if the magnetization fixed layer has larger coercivity, a larger magnetic film thickness, or a larger magnetic damping constant, as compared with the storage layer. To fix the direction of the magnetization of the magnetization fixed layer, for example, it is sufficient if an antiferromagnetic material such as PtMn or IrMn is provided in contact with the magnetization fixed layer. Alternatively, a magnetic material in contact with such an antiferromagnetic material may be magnetically coupled to the magnetization fixed layer through a non-magnetic material such as Ru to indirectly fix the direction of the magnetization of the magnetization fixed layer.

The insulating layer in the storage element 24 is an intermediate layer serving as a tunnel barrier layer (a tunnel insulating layer), and includes, for example, aluminum oxide or magnesium oxide (MgO). In particular, the insulating layer preferably includes magnesium oxide. A reason for this is that magnesium oxide makes it possible to increase a magnetoresistive ratio (MR ratio), and to improve spin injection efficiency, thereby reducing current density for reversing the direction of the magnetization of the storage layer.

The storage layer in the storage element 24 includes a ferromagnetic material having a magnetic moment in which the direction of the magnetization of the magnetic fixed layer is freely changed to the direction perpendicular to the film surface. The storage layer includes, for example, Co—Fe—B.

[Workings and Effects of Imaging Device 1]

As described above, the imaging device 1 according to the present embodiment has a two-layer configuration in which the front surface 10S of the sensor substrate 10 and the front surface 20S of the circuit substrate 20 are adhered to each other. The sensor substrate 10 includes the wiring layer 11 and the semiconductor layer 12 that are stacked in order from a position close to the circuit substrate 20. The circuit substrate 20 includes the wiring layer 21, the storage element layer 22, and the semiconductor layer 23 that are stacked in order from a position close to the sensor substrate 10. Thus, a distance between the wiring layer 11 in the sensor substrate 10 and the storage element 24 in the circuit substrate 20 is close. This makes it possible to shorten lengths of the wiring lines 26 and the vias 27 that couple the electrode 13 of the wiring layer 11 in the sensor substrate 10 and the storage element 24 in the circuit substrate 20 to each other, and reduce electrical resistance of the wiring lines 26 and the like, as well as to achieve simplification of a manufacturing process. In addition, this makes it possible to suppress spreading to an XY in-plane direction and achieve space-saving, which contributes downsizing of dimensions of the entire imaging device 1. Accordingly, the imaging device 1 according to the present embodiment is suitable for higher integration.

In addition, in the imaging device 1 according to the present embodiment, the hydrogen block layer 29 is provided around the storage element 24, which makes it possible to prevent the deterioration-causing materials such as the hydrogen gas generated in the manufacturing process of the imaging device 1 from reaching the storage element 24. This makes it possible to effectively suppress deterioration in performance of the storage element 24. Furthermore, in the imaging device 1, in a case where the lower electrode BE and the upper electrode TE that are provided to sandwich the storage element 24 therebetween in the Z-axis direction include titanium, it is possible to more effectively prevent the deterioration-causing materials described above from reaching the storage element 24. In particular, in a case where the thickness ZTE of the upper electrode TE is made larger than the thickness ZBE of the lower electrode BE, it is possible to still more effectively prevent entry of the deterioration-causing materials into the storage element 24. In addition, making the thickness ZTE of the upper electrode TE larger than the thickness ZBE of the lower electrode BE makes it possible to reduce damage to the storage element 24 in other processes after formation of the storage elements 24, such as a hole making process in which an opening of the side wall section SW for coupling of the contact layer 25B to the upper electrode TE, for example.

In addition, in the imaging device 1, the contact layer 25A has a two-layer configuration including the core 25A1 and the barrier layer 25A2. Accordingly, for example, forming the core 25A1 using W (tungsten) by a CVD method makes it possible to achieve the contact layer 25A having a shape elongated in the Z-axis direction. This makes it possible to cope with a case where a large number of storage elements 24 is arranged in a narrow region, contributing to higher integration. Here, W (tungsten) tends to have low adhesion with the material, e.g., $SiO_2$, of the insulating layer 20Z; therefore, interposing the barrier layer 25A2 between the core 25A1 and the insulating layer 20Z makes it possible to enhance adhesion between the contact layer 25A and the insulating layer 20Z. The barrier layer 25A2 may include a laminated film including a TiN film covering the core 25A1 and a Ti film covering the TiN film. In this case, the TiN film is specifically superior in adhesion with W (tungsten), and the Ti film is specifically superior in adhesion with $SiO_2$, which makes it possible to further enhance adhesion between the contact layer 25A and the insulating layer 20Z. In addition, in a case where the barrier layer 25A2 includes Ti (titanium), it is possible to store the deterioration-causing materials such as the hydrogen radical, which makes it possible to further reduce a possibility of deterioration in performance of the storage element 24.

It is to be noted that in the imaging device 1 according to the present embodiment, a barrier layer including Ti (titanium) may be further formed to cover each of the wiring lines 26 and each of the vias 27. This makes it possible to more effectively prevent the deterioration-causing materials such as the hydrogen radical from reaching the storage element 24.

1-2. First Modification Example

Figure 3:
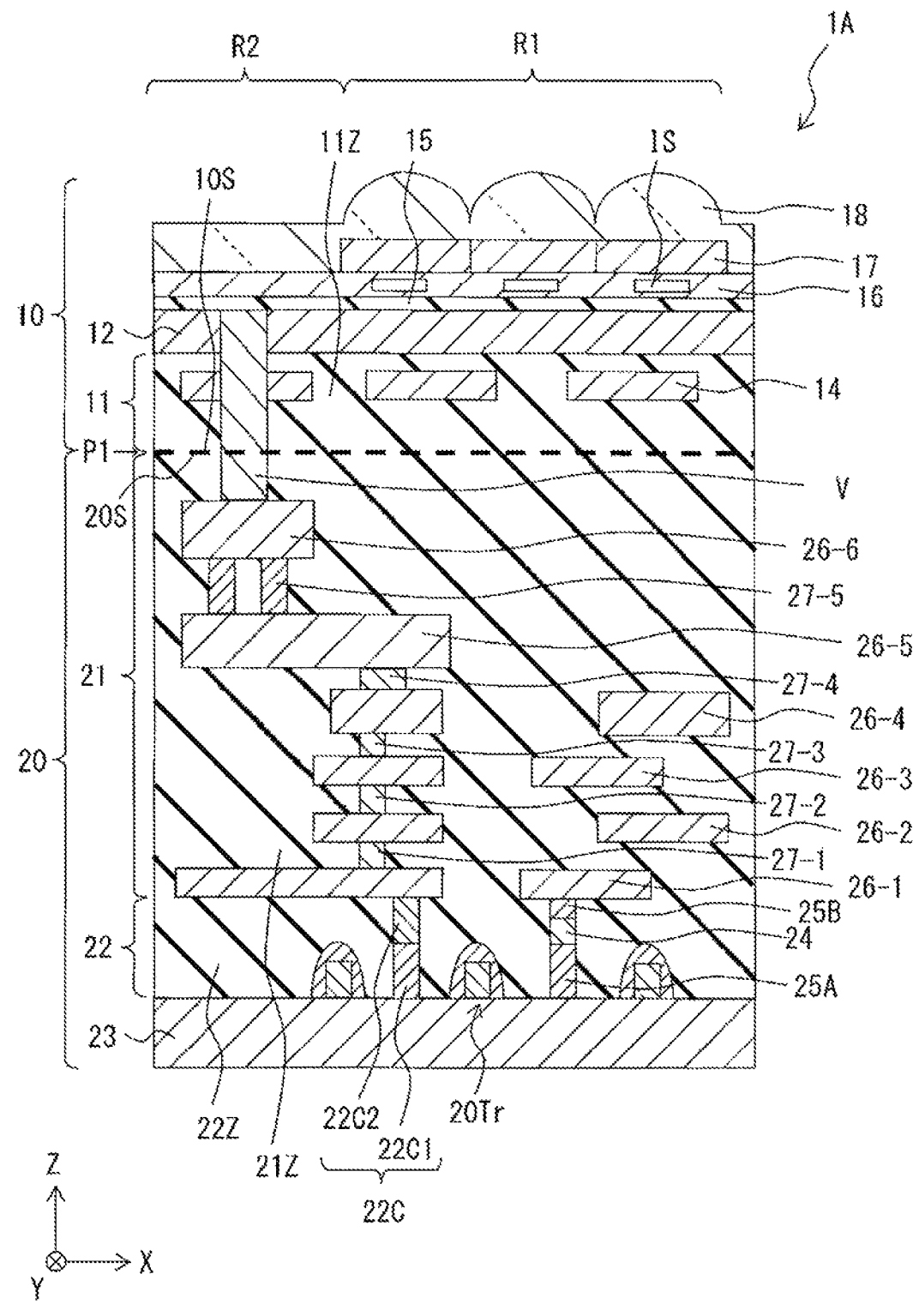
FIG. 3 is a cross-sectional view of an entire configuration example of an imaging device as a first modification example of the present disclosure.

In the imaging device 1 according to the above-described first embodiment, the electrode 13 exposed to the front surface 10S and the electrode 28 exposed to the front surface 20S are joined by Cu—Cu bonding; however, the present disclosure is not limited thereto. The present disclosure is a concept including an imaging device 1A as a first modification example of the present disclosure illustrated in FIG. 3. In the imaging device 1A, the wiring line 14 of the sensor substrate 10 and the wiring line 26-6 of the circuit substrate 20 are coupled to each other by a via V that penetrates the front surface 10S and the front surface 20S. In addition, in the imaging device 1A, the electrode 13 exposed to the front surface 10S and the electrode 28 exposed to the front surface 20S are not present. The imaging device 1A has substantially the same configuration as that of the imaging device 1 according to the above-described first embodiment, except for these points.

1-3. Second Modification Example

Figure 4:
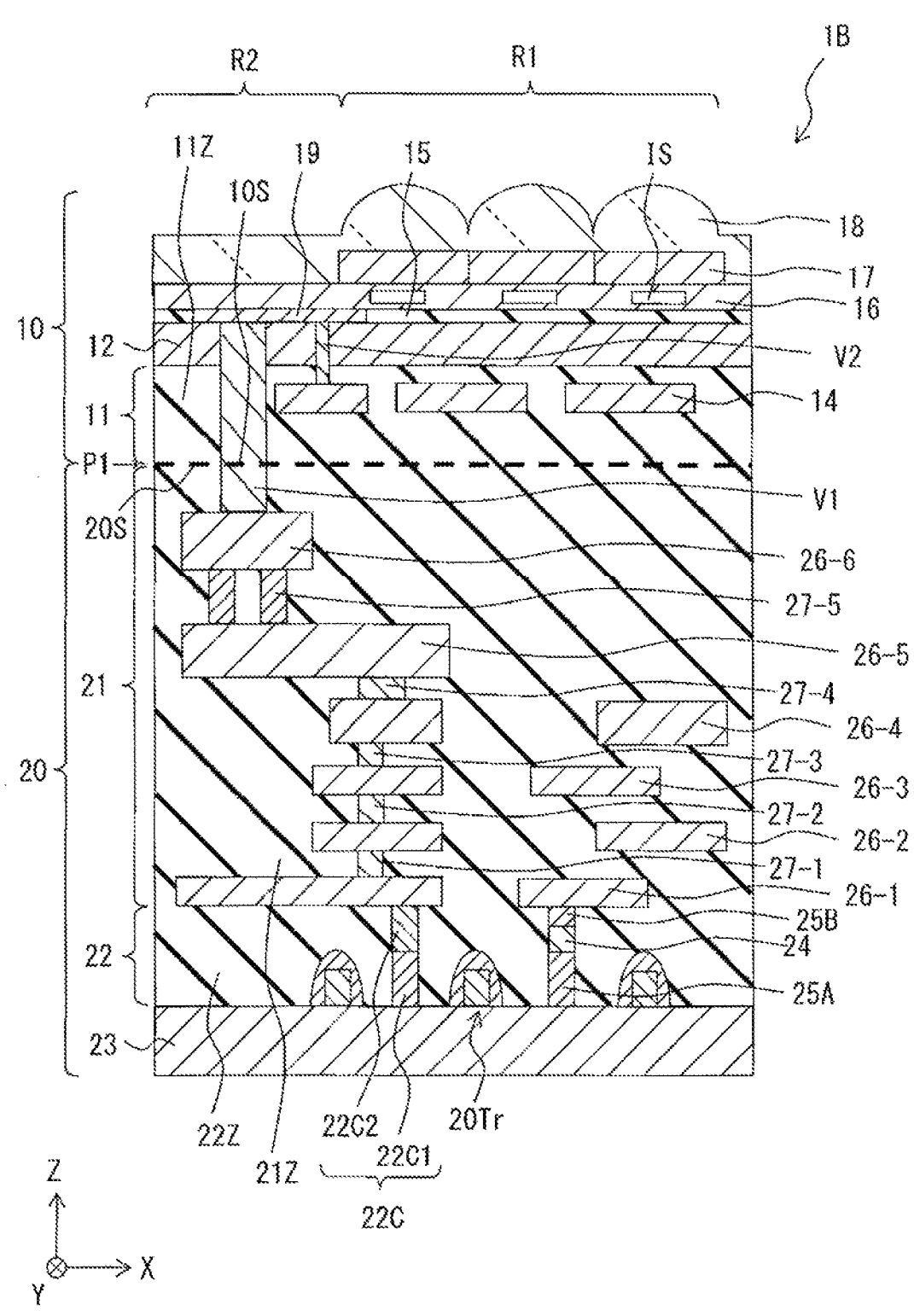
FIG. 4 is a cross-sectional view of an entire configuration example of an imaging device as a third modification example of the present disclosure.

The present disclosure is a concept including an imaging device 1B as a second modification example of the present disclosure illustrated in FIG. 4. The imaging device 1B includes a via V1 that penetrates the front surface 20S, the front surface 10S, the wiring layer 11 and the semiconductor layer 12 from the wiring line 26-6 to reach the semiconductor layer 16, a wiring line 19 that is provided in the insulating layer 15 to be coupled to the via V1, and a via V2 that penetrates the semiconductor layer 12 from the wiring line 19 to reach the wiring line 14. In addition, in the imaging device 1B, as with the imaging device 1A, the electrode 13 exposed to the front surface 10S and the electrode 28 exposed to the front surface 20S are not present. The imaging device 2B has substantially the same configuration as that of the imaging device 1 according to the above-described first embodiment, except for these points.

1-4. Third Modification Example

Figure 5:
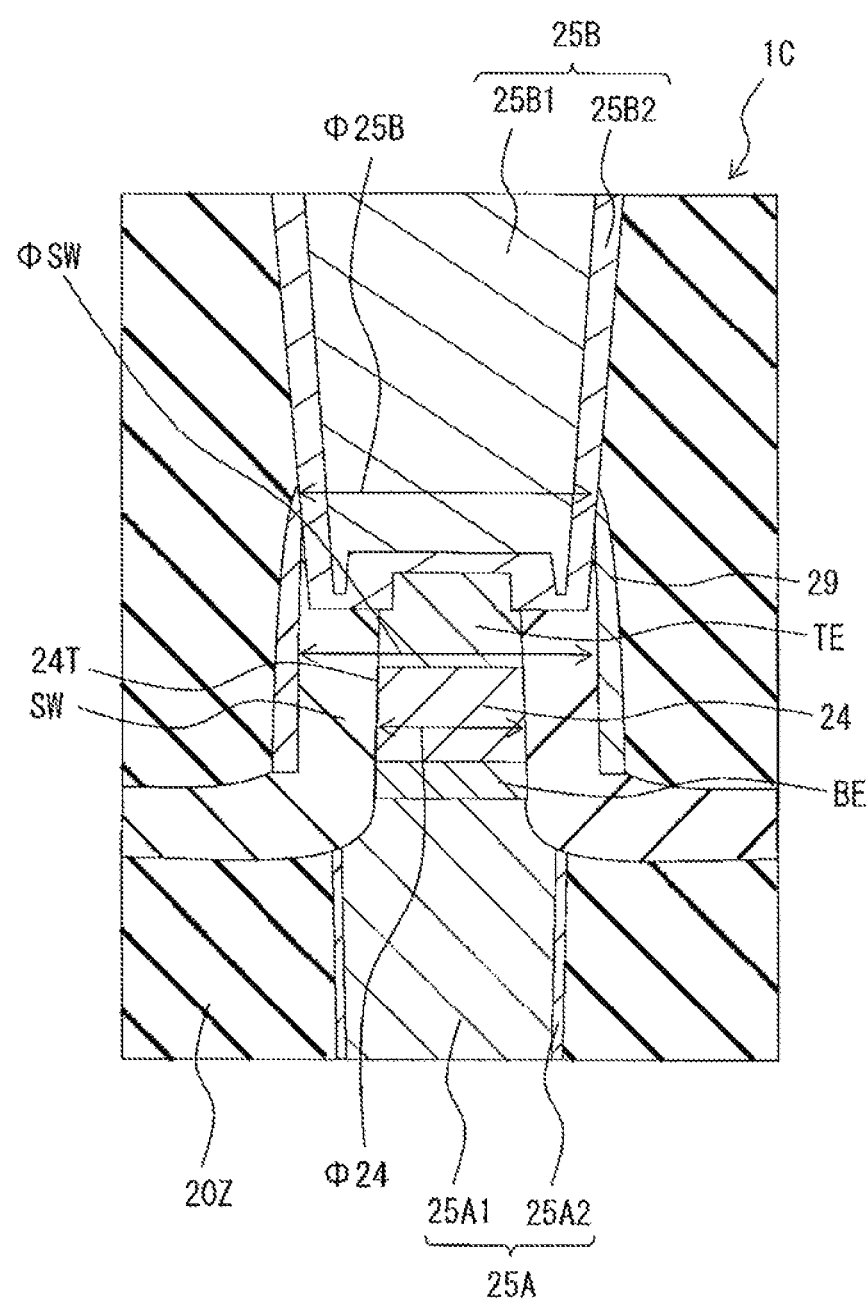
FIG. 5 is an enlarged cross-sectional view of a main-part configuration example of an imaging device as a fourth modification example of the present disclosure.
Figure 5:
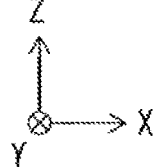

FIG. 5 is an enlarged cross-sectional view of enlarged detail near the storage element 24 in an imaging device 1C as a third modification example of the present disclosure. As illustrated in FIG. 5, in the imaging device 1C, in the XY in-plane direction, an outer diameter Φ25B of the barrier layer 25B2 of the contact layer 25B is larger than an outer diameter Φ24 of the storage element 24, and substantially coincides with an outer diameter ΦSW of the side wall section SW. Accordingly, the barrier layer 25B2 of the contact layer 25B is coupled to the hydrogen block layer 29. This makes it possible to prevent entry from a gap between the barrier layer 25B2 and the hydrogen block layer 29 into the storage element 24 through the side wall section SW. It is to be noted that the barrier layer 25A2 of the contact layer 25A and the hydrogen block layer 29 are electrically separated from each other by the side wall section SW. Accordingly, the contact layer 25A and the contact layer 25B are not short-circuited through the hydrogen block layer 29.

1-5. Fourth Modification Example

Figure 6:
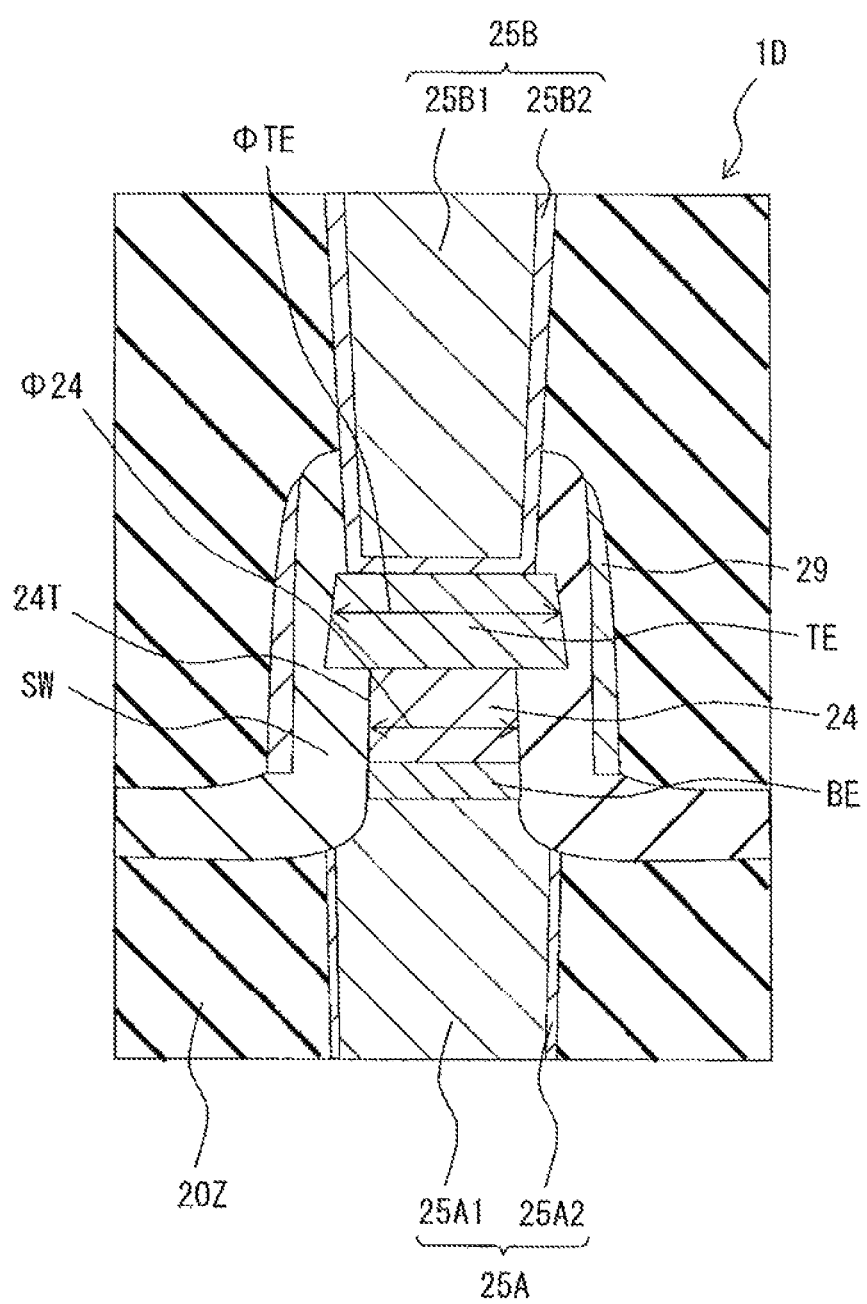
FIG. 6 is an enlarged cross-sectional view of a main-part configuration example of an imaging device as a fifth modification example of the present disclosure.
Figure 6:
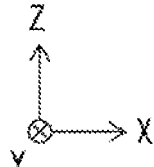

FIG. 6 is an enlarged cross-sectional view of enlarged detail near the storage element 24 in an imaging device 1D as a fourth modification example of the present disclosure. As illustrated in FIG. 6, in the imaging device 1D, in the XY in-plane direction, an outer diameter ΦTE of the upper electrode TE is larger than the outer diameter Φ24 of the storage element 24. In the imaging device 1D, such a configuration makes it easy to adjust a position of the contact layer 25B with respect to the upper electrode TE in a case of forming the contact layer 25B. In addition, the upper electrode TE having a larger dimension in the XY in-plane direction covers the storage element 24, which makes it possible to effectively prevent deterioration-causing materials from layers above the storage element 24, that is, the wiring layer 21 and the like from entering into the storage element 24.

2. Second Embodiment

2-1. Basic Embodiment

[Configuration of Imaging Device 2]

Figure 7:
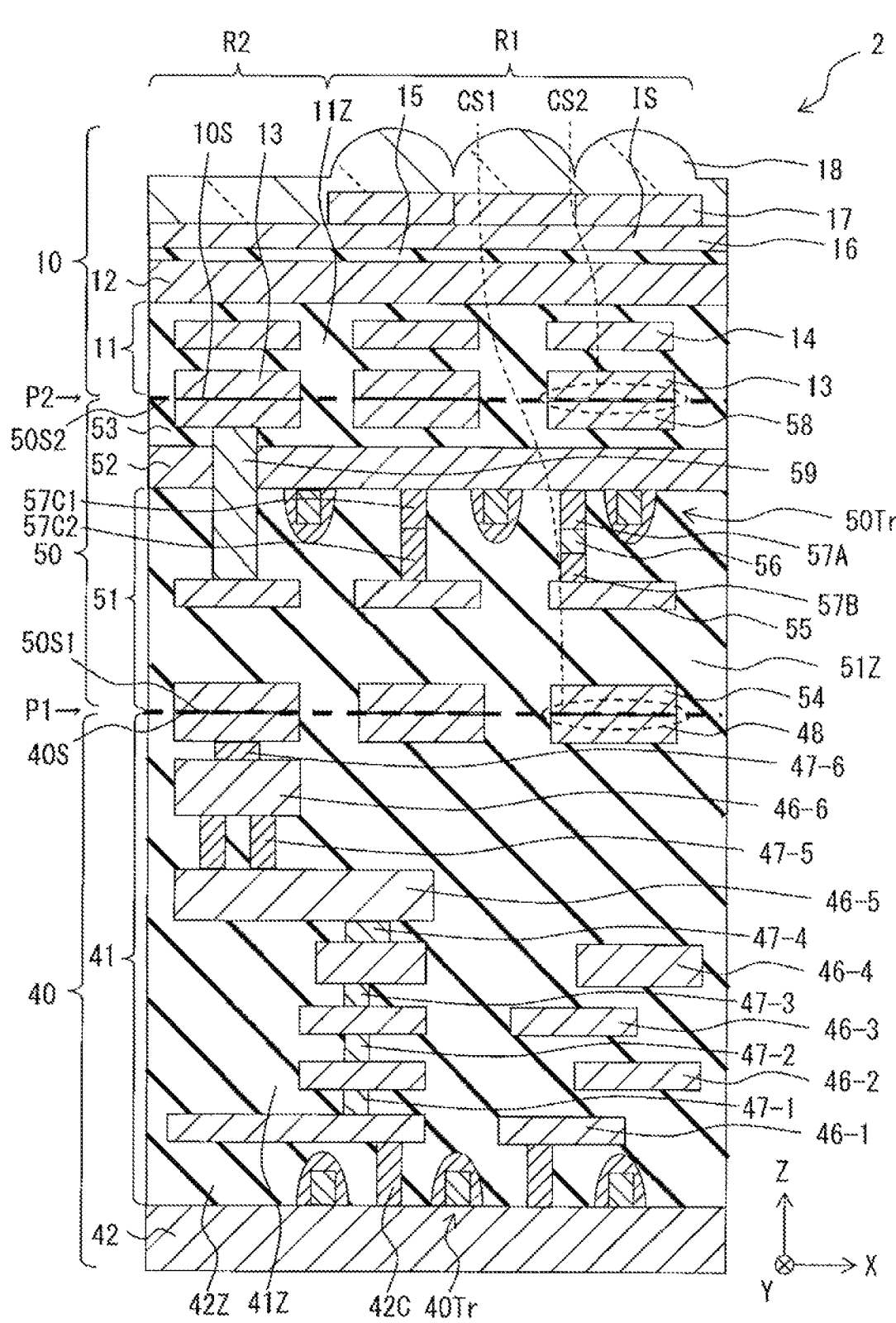
FIG. 7 is a cross-sectional view of a configuration example of an imaging device according to a second embodiment of the present disclosure.

FIG. 7 illustrates a cross-sectional configuration of an imaging device 2 as a second embodiment of the present disclosure. In the above-described first embodiment, description has been given, as an example, of the imaging device 1 having a two-layer configuration in which the front surface 10S of the sensor substrate 10 including the solid-state imaging element IS and the front surface 20S of the circuit substrate 20 including the storage element 24 are joined together. In contrast, the imaging device 2 according to the second embodiment has a three-layer configuration in which a logic substrate 40, an intermediate substrate 50, and the sensor substrate 10 are stacked in order, as illustrated in FIG. 7. The sensor substrate 10 of the imaging device 2 is substantially the same as the sensor substrate 10 of the imaging device 1 according to the above-described first embodiment, and description thereof is omitted. It is to be noted that in the imaging device 2, the logic substrate 40 is a specific example corresponding to a "first substrate" of the present disclosure, the intermediate substrate 50 is a specific example corresponding to a "second substrate" of the present disclosure, and the sensor substrate 10 is a specific example corresponding to a "third substrate" of the resent disclosure.

In the imaging device 2, a front surface 40S of the logic substrate 40 and a front surface 50S1 of the intermediate substrate 50 are joined together at the position P1, and a rear surface 50S2 of the intermediate substrate 50 and the front surface 10S of the sensor substrate 10 are joined together at the position P1.

(Logic Substrate 40)

The logic substrate 40 includes a wiring layer 41 and a semiconductor layer 42 that are stacked in order from a position close to the intermediate substrate 50. In the wiring layer 41, for example, a logic circuit such as a signal processing circuit is formed.

In the wiring layer 41, wiring lines 46-1 to 46-6, vias 47-1 to 47-6, a transistor 40Tr, and an electrode 48 are embedded in an insulating layer 41Z including $SiO_2$ or the like, for example. However, a portion of the electrode 48 is exposed to the front surface 40S. In addition, all the electrode 48, the wiring lines 46-1 to 46-6, and the vias 47-1 to 47-6 are formed including a highly electrically conductive nonmagnetic material such as Cu (copper), for example. In addition, the wiring lines 46-1 to 46-6 and the vias 47-1 to 47-6 are alternately stacked in order from the semiconductor layer 42 side. It is to be noted that in the following description, there are cases where the wiring lines 46-1 to 46-6 are comprehensively referred to as "wiring lines 46" and the vias 47-1 to 47-6 are comprehensively referred to as "vias 47".

(Intermediate Substrate 50)

The intermediate substrate 50 includes a wiring layer 51, a semiconductor layer 52, and a wiring layer 53 that are stacked in order from a position close to the logic substrate 40.

The wiring layer 51 includes an electrode 54, a wiring line 55, a storage element 56, a contact layer 57A, a contact layer 57B, and a transistor 50Tr. The electrode 54, the wiring line 55, the storage element 56, the contact layer 57A, the contact layer 57B, and the transistor 50Tr are embedded in an insulating layer 51Z including SiO2 or the like, for example. However, a portion of the electrode 54 is exposed to the front surface 50S1, and is joined to the electrode 48 exposed to the front surface 40S to form a joint section CS1. In addition, the electrode 54, the wiring line 55, and the contact layers 57A and 57B each are formed including a highly electrically conductive nonmagnetic material such as Cu (copper), for example. The storage element 56 has substantially the same configuration as that of the storage element 24 in the imaging device 1 according to the above-described first embodiment. The transistor 50Tr is provided between the storage element 56 and the semiconductor layer 52, for example, near a front surface of the semiconductor layer 52. The contact layer 57A includes an electrically conductive layer coupled to the storage element 56 and one of a source electrode and a drain electrode in the transistor 50Tr. In addition, the contact layer 57B includes an electrically conductive layer coupled to the storage element 56 and the wiring line 55. Furthermore, the other of the source electrode and the drain electrode in the transistor 50Tr is coupled to another wiring line 55 through a contact layer 57C1 and a contact layer 57C2. Examples of the semiconductor layer 52 include a Si (silicon) substrate.

The wiring layer 53 includes an electrode 58 and an insulating layer 53Z with which surroundings of the electrode 58 are filled. The electrode 58 is coupled to the wiring line 55 in the wiring layer 51 by a contact layer 59. Furthermore, a portion of the electrode 58 is exposed to the rear surface 50S2, and is joined to the electrode 13 exposed to the front surface 10S to form a joint section CS2. Both the electrode 54 and the contact layer 59B are formed including a highly electrically conductive nonmagnetic material such as Cu (copper), for example.

It is to be noted that in the imaging device 2, it is sufficient if the joint sections CS1 and CS2 are formed at a position overlapping the pixel region R1 in the stacking direction (the Z-axis direction). However, the joint sections CS1 and CS2 may be formed in the peripheral region R2. In addition, the electrode 54 and the electrode 48 form the joint section CS1 by Cu—Cu bonding in which Cu included in the electrode 54 and Cu included in the electrode 48 are directly bonded together, for example. Electrical conduction between the electrode 54 and the electrode 48 is secured by the Cu—Cu bonding. Similarly, the electrode 58 and the electrode 13 form the joint section CS2 by Cu—Cu bonding in which Cu included in the electrode 58 and Cu included in the electrode 13 are directly bonded together, for example. Electrical conduction between the electrode 58 and the electrode 13 is secured by the Cu—Cu bonding.

[Workings and Effects of Imaging Device 2]

As described above, the imaging device 2 according to the present embodiment has a three-layer configuration in which the logic substrate 40, the intermediate substrate 50, and the sensor substrate 10 are stacked in order. Here, the front surface 40S of the logic substrate 40 and the front surface 50S1 of the intermediate substrate 50 are adhered to each other to be opposed to each other. The logic substrate 40 includes the wiring layer 41 and the semiconductor layer 42 that are stacked in order from a position close to the intermediate substrate 50. The intermediate substrate 50 includes the wiring layer 51 including the storage element 56, and the semiconductor layer 52 that are stacked in order from a position close to the logic substrate 40. Thus, a distance between the wiring layer 41 in the logic substrate 40 and the storage element 56 in the intermediate substrate 50 is close. This makes it possible to shorten a length of a wiring line or the like that couples the electrode 48 provided in the wiring layer 41 in the logic substrate 40 and the storage element 56 in the intermediate substrate 50 to each other, and reduce electrical resistance of the wiring line or the like, as well as to achieve simplification of a manufacturing process. In addition, this makes it possible to suppress spreading to the XY in-plane direction and achieve space-saving, which contributes downsizing of dimensions of the entire imaging device 1. Accordingly, the imaging device 2 according to the present embodiment is suitable for higher integration.

In addition, even in the imaging device 2 according to the present embodiment, providing a hydrogen block layer around the storage element 56 makes it possible to prevent deterioration-causing materials such as a hydrogen gas generated in a manufacturing process of the imaging device 2 from reaching the storage element 56. This consequently makes it possible to avoid deterioration in performance of the storage element 56.

2-2. Fifth Modification Example

Figure 8:
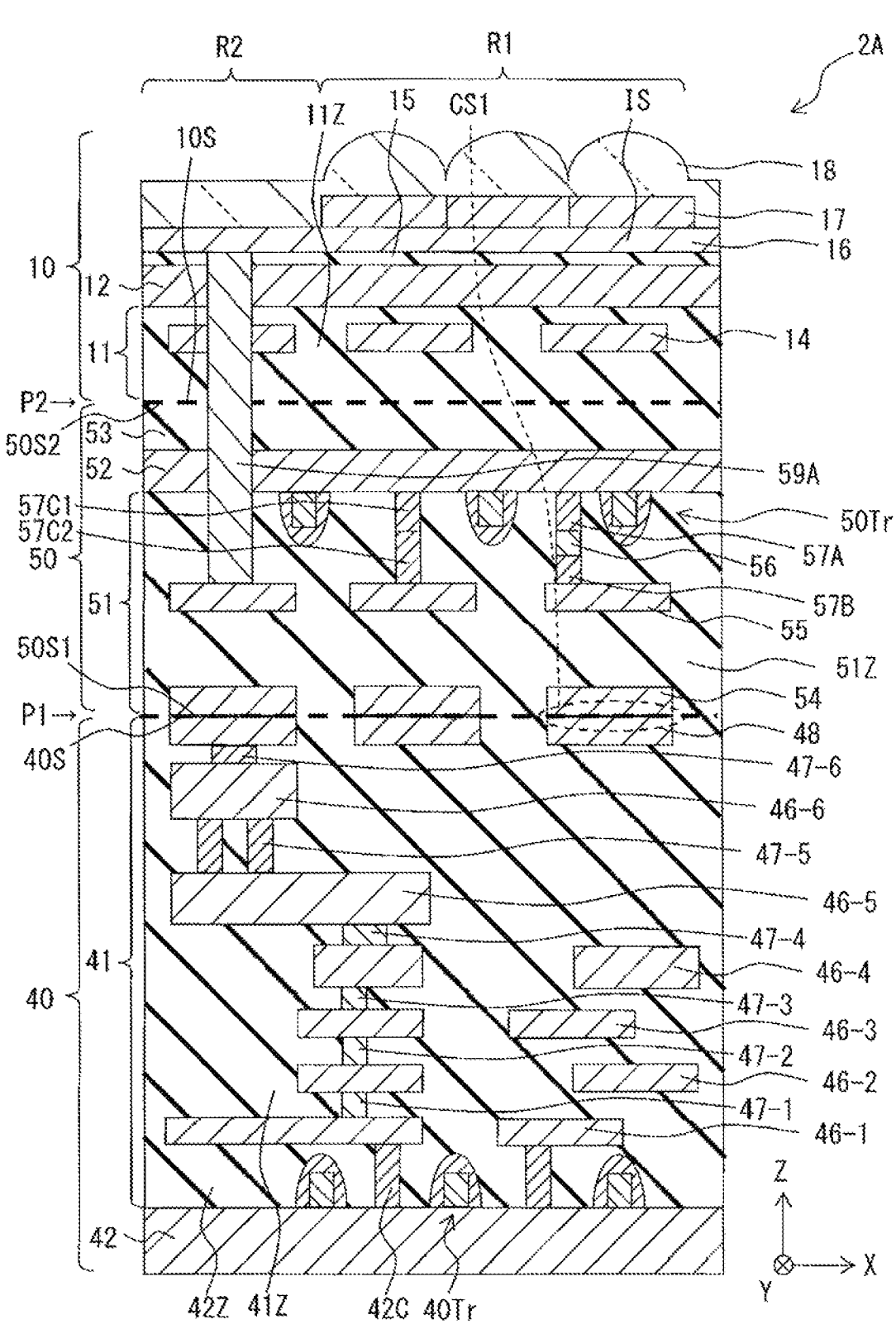
FIG. 8 is a cross-sectional view of an entire configuration example of an imaging device as a fifth modification example of the present disclosure.
Figure 9:
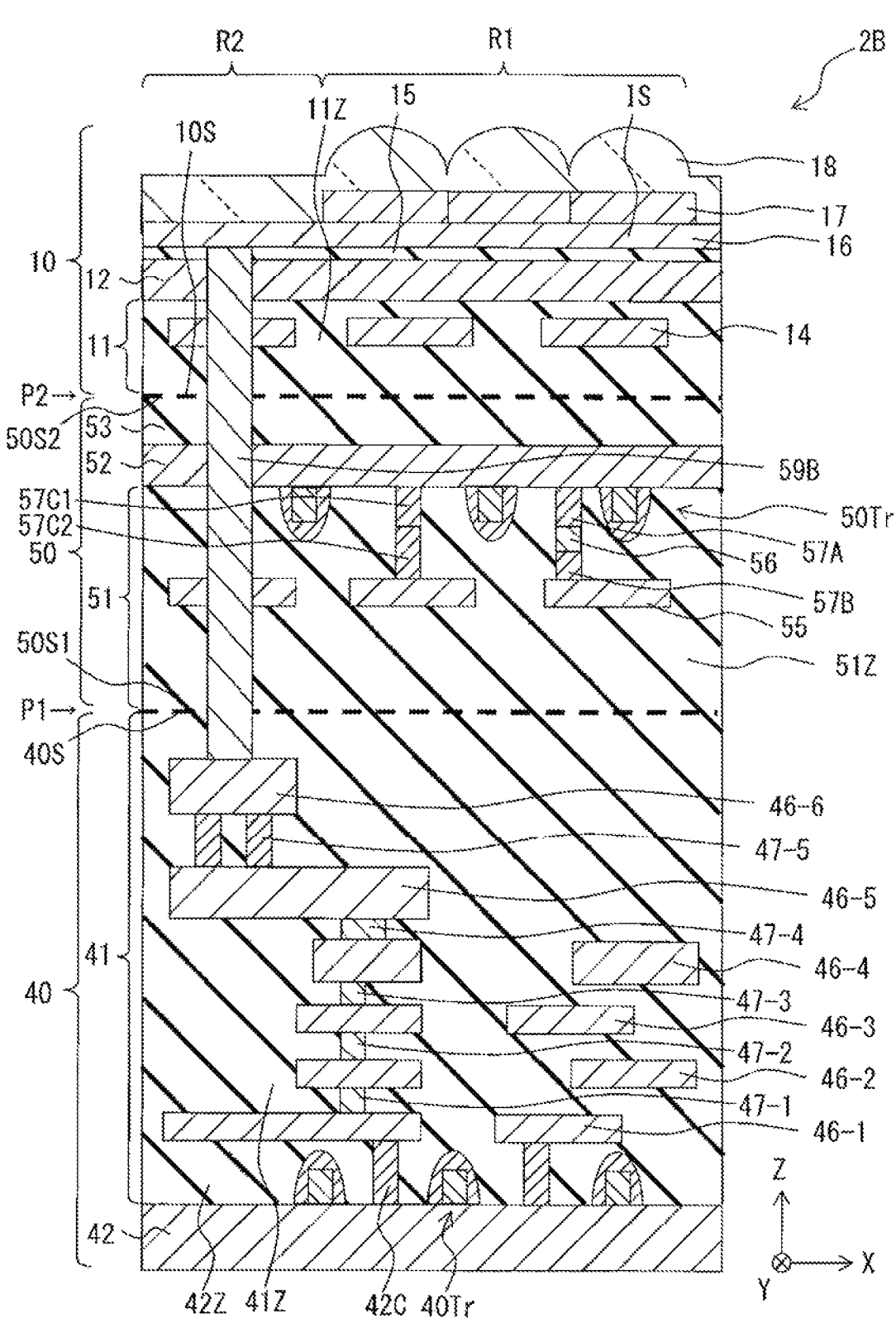
FIG. 9 is a cross-sectional view of an entire configuration example of an imaging device as a sixth modification example of the present disclosure.

In the imaging device 2 according to the above-described second embodiment, the electrode 58 exposed to the rear surface 50S2 and the electrode 13 exposed to the front surface 10S are joined together at an interface between the intermediate substrate 50 and the sensor substrate 10 by Cu—Cu bonding; however, the present disclosure is not limited thereto. The present disclosure is a concept including an imaging device 2A as a fifth modification example of the present disclosure illustrated in FIG. 8. In the imaging device 2A, a contact layer 59A in place of the contact layer 59 penetrates the rear surface 50S2, the front surface 10S, the wiring layer 11, and the semiconductor layer 12, and the wiring line 14 of the sensor substrate 10 and the wiring line 55 of the intermediate substrate 50 are coupled to each other by the contact layer 59A. In addition, in the imaging device 2A, the electrode 13 exposed to the front surface 10S and the electrode 58 exposed to the rear surface 50S2 are not present. The imaging device 2A has substantially the same configuration as that of the imaging device 2 according to the above-described second embodiment except for these points.

2-3. Sixth Modification Example

The present disclosure is a concept including an imaging device 2B as a sixth modification example of the present disclosure. The imaging device 2B includes a contact layer 59B. The contact layer 59B is provided to penetrate the front surface 40S, the front surface 50S1, the wiring layer 51, the semiconductor layer 52, the wiring layer 53, the rear surface 50S2, the front surface 10S, the wiring layer 11, the semiconductor layer 12, and the insulating layer 15 from the wiring line 46-6 to reach the semiconductor layer 16. In addition, in the imaging device 2B, the electrode 13 exposed to the front surface 10S, the electrode 58 exposed to the rear surface 50S2, the electrode 54 exposed to the front surface 50S1, and the electrode 48 exposed to the front surface 40S are not present. The imaging device 2B has substantially the same configuration as that of the imaging device 2 according to the above-described second embodiment except for these points.

2-4. Seventh Modification Example

Figure 10:
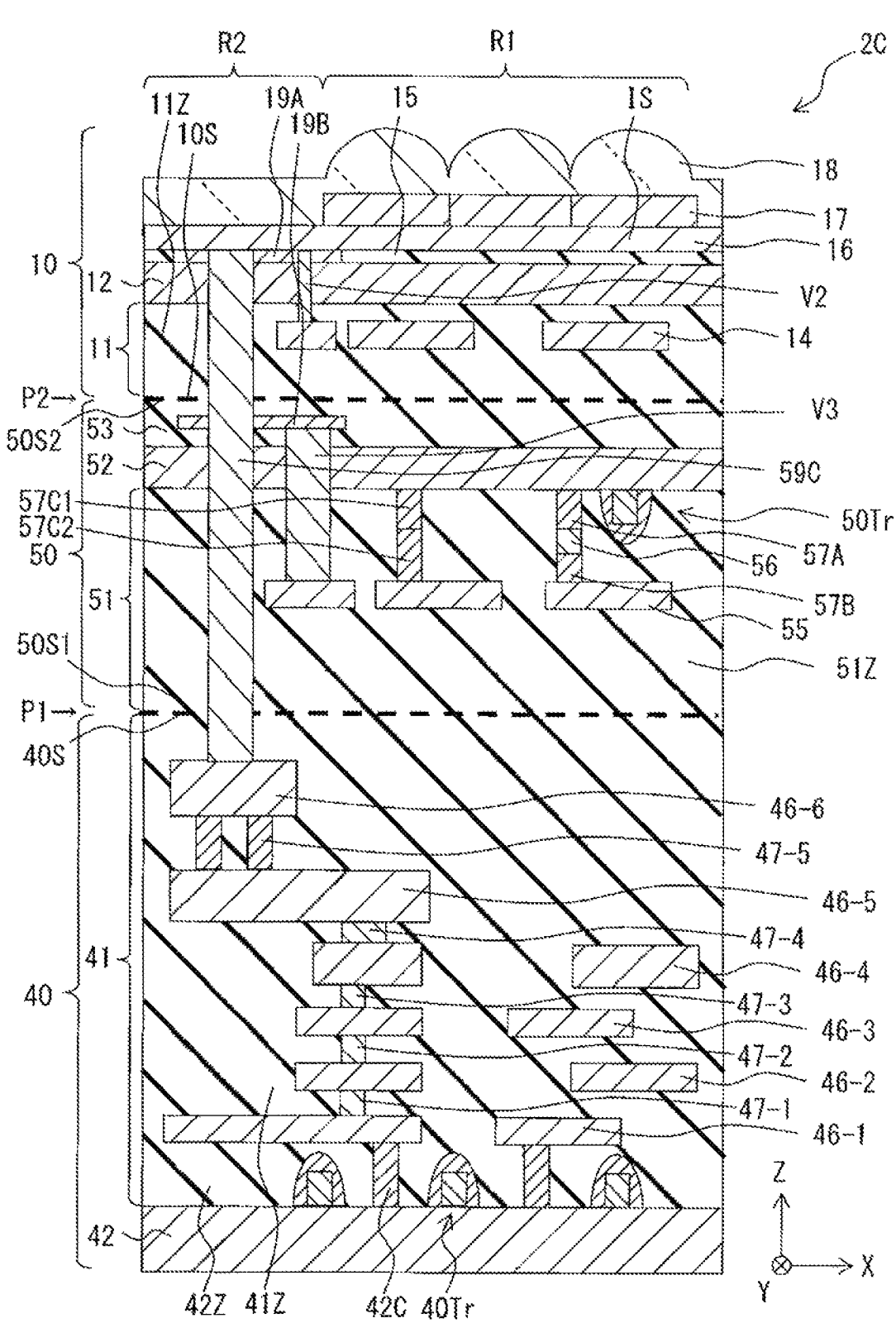
FIG. 10 is a cross-sectional view of an entire configuration example of an imaging device as a seventh modification example of the present disclosure.

The present disclosure is a concept including an imaging device 2C as a seventh modification example of the present disclosure illustrated in FIG. 10. The imaging device 2C includes a contact layer 59C, a wiring line 19A, and a via V2. The contact layer 59C penetrates the front surface 40S, the front surface 40S1, the wiring layer 51, the semiconductor layer 52, the wiring layer 53, the rear surface 50S2, the front surface 10S, the wiring layer 11, the semiconductor layer 12, and the insulating layer 15 from the wiring line 46-6 to reach the semiconductor layer 16. The wiring line 19A is provided in the insulating layer 15 to be coupled to the contact layer 59C. The via V2 penetrates the semiconductor layer 12 from the wiring line 19A to reach the wiring line 14. In addition, the imaging device 2C further includes a wiring line 19B and a via V3. The wiring line 19B is embedded in the wiring layer 53 to be coupled to the contact layer 59C, and the via V3 penetrates the semiconductor layer 52 and the insulating layer 51Z from the wiring line 19B to reach the wiring line 55. It is to be noted that in the imaging device 2C, as with the imaging device 2B, the electrode 13 exposed to the front surface 10S, the electrode 58 exposed to the rear surface 50S2, the electrode 54 exposed to the front surface 50S1, and the electrode 48 exposed to the front surface 40S are not present. The imaging device 2C has substantially the same configuration as that of the imaging device 2 according to the above-described second embodiment except for these points.

2-5. Eighth Modification Example

Figure 11:
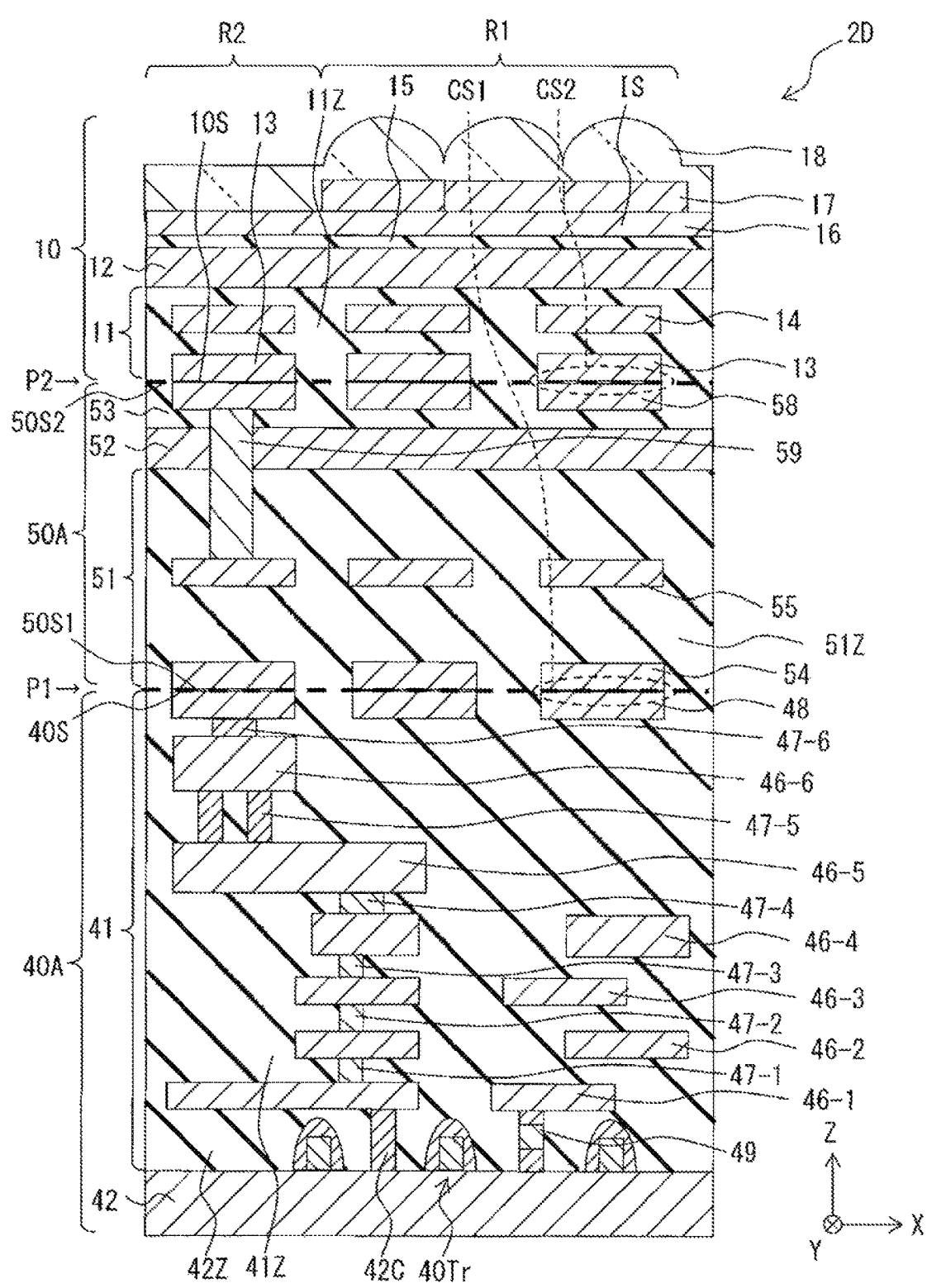
FIG. 11 is a cross-sectional view of an entire configuration example of an imaging device as an eighth modification example of the present disclosure.

The present disclosure is a concept including an imaging device 2D as an eighth modification example of the present disclosure illustrated in FIG. 11. The imaging device 2D includes a logic substrate 40A in place of the logic substrate 40 and an intermediate substrate 50A in place of the intermediate substrate 50. The imaging device 2D has substantially the same configuration as that of the imaging device 2 according to the above-described second embodiment except for these points. Specifically, in the above-described imaging device 2, the storage element 56 is provided in the intermediate substrate 50, as illustrated in FIG. 7. In contrast, in the imaging device 2D, the intermediate substrate 50A does not include a storage element and a storage element 49 is provided in the logic substrate 40A, as illustrated in FIG. 11.

3. Third Embodiment: Example of Application to Electronic Apparatus

Figure 12:
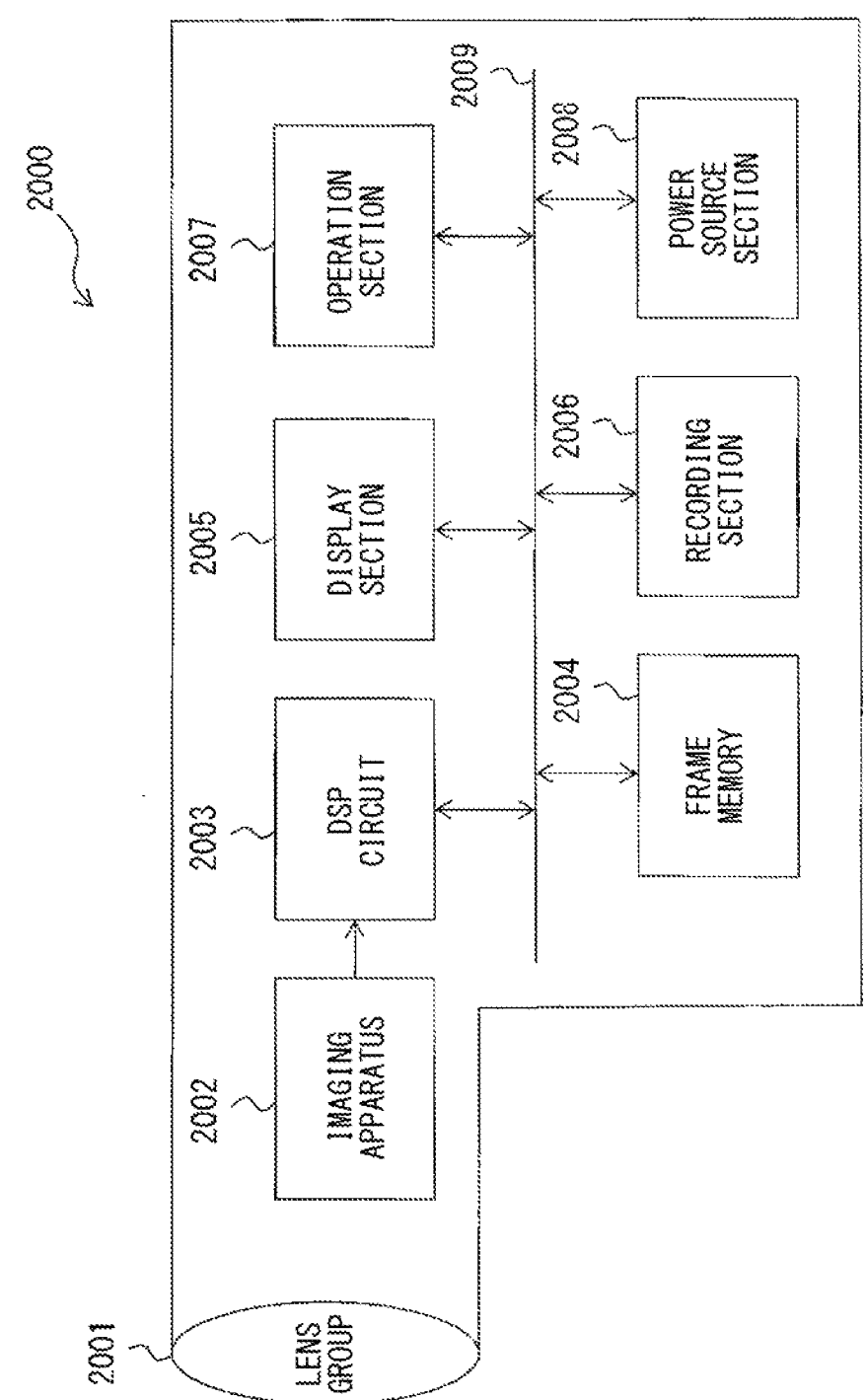
FIG. 12 is a schematic view of an entire configuration example of an electronic apparatus according to a third embodiment of the present disclosure.

FIG. 12 is a block diagram illustrating a configuration example of a camera 2000 as an electronic apparatus to which the present technology is applied.

The camera 2000 includes an optical section 2001 including a lens group and the like, an imaging device (imaging device) 2002 to which any of the above-described imaging devices 1, 1A to 1D, 2, 2A to 2D, and the like (hereinafter referred to as the imaging device 1 or the like) is applied, and a DSP (Digital Signal Processor) circuit 2003 that is a camera signal processing circuit. Further, the camera 2000 also includes a frame memory 2004, a display section 2005, a recording section 2006, an operation section 2007, and a power source section 2008. The DSP circuit 2003, the frame memory 2004, the display section 2005, the recording section 2006, the operation section 2007, and the power source section 2008 are coupled to one another through a bus line 2009.

The optical section 2001 captures incident light (image light) from a subject and forms an image on an imaging plane of the imaging device 2002. The imaging device 2002 converts the light amount of the incident light of which the image is formed on the imaging plane by the optical section 2001 into an electric signal on a pixel-by-pixel basis and outputs the electric signal as a pixel signal.

The display section 2005 includes, for example, a panel type display device such as a liquid crystal panel and an organic EL panel, and displays a moving image or a still image captured by the imaging device 2002. The recording section 2006 records the moving image or the still image captured by the imaging device 2002 on a recording medium such as a hard disk or a semiconductor memory.

The operation section 2007 is operated by a user to issue operation instructions for various functions of the camera 2000. The power source section 2008 supplies the DSP circuit 2003, the frame memory 2004, the display section 2005, the recording section 2006, and the operation section 2007 with various types of power as power for operating these supply targets as appropriate.

As described above, use of the above-described imaging device 1 or the like as the imaging device 2002 makes it possible to expect acquirement of a favorable image.

4. Example of Practical Application to Mobile Body

The technology (the present technology) according to the present disclosure is applicable to various products. For example, the technology according to the present disclosure may be achieved as a device mounted on any type of mobile body such as a vehicle, an electric vehicle, a hybrid electric vehicle, a motorcycle, a bicycle, a personal mobility, an airplane, a drone, a vessel, or a robot.

Figure 13:
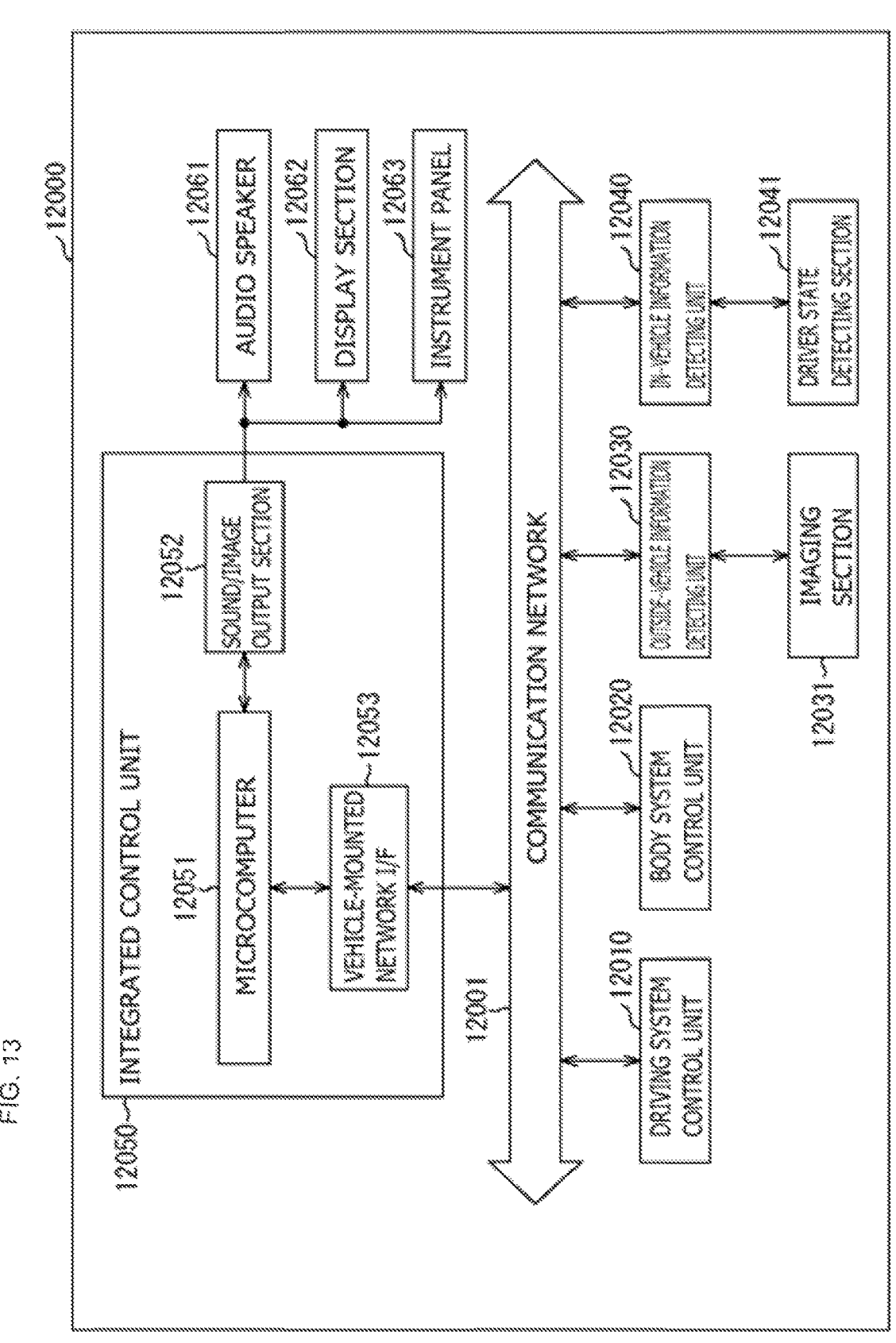
FIG. 13 is a block diagram depicting an example of schematic configuration of a vehicle control system.

FIG. 13 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 13, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 13, an audio speaker 12061, a display section 12062, and an instrument panel 12063 are illustrated as the output device. The display section 12062 may, for example, include at least one of an on-board display and a head-up display.

Figure 14:
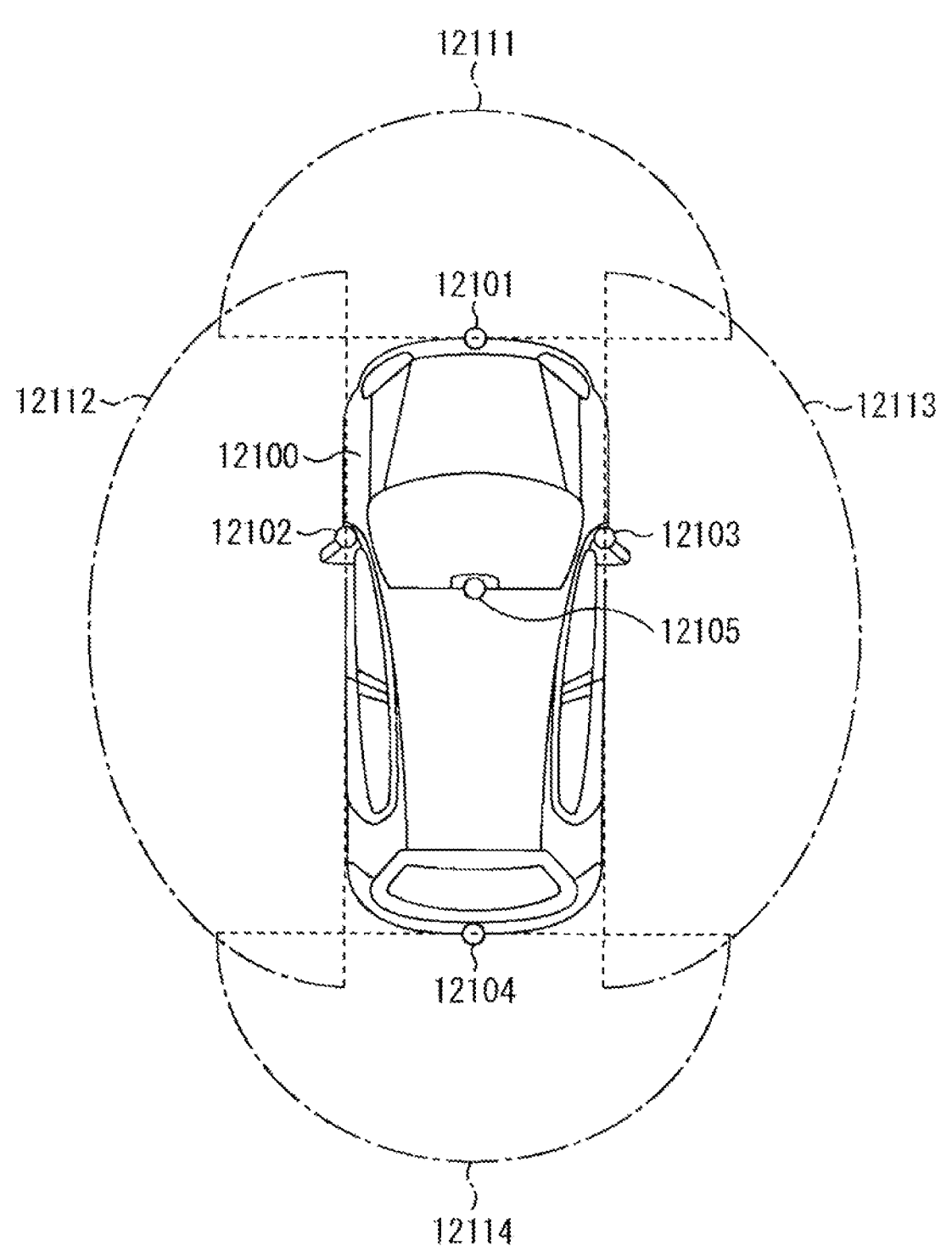
FIG. 14 is a diagram of assistance in explaining an example of installation positions of an outside-vehicle information detecting section and an imaging section.

FIG. 14 is a diagram depicting an example of the installation position of the imaging section 12031.

In FIG. 14, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 14 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

One example of the vehicle control system to which the technology according to the present disclosure may be applied has been described above. The technology according to the present disclosure may be applied to the imaging section 12031 among the components described above. Specifically, the imaging device 1 or the like illustrated in FIG. 1 etc. is applicable to the imaging section 12031. Applying the technology according to the present disclosure to the imaging section 12031 makes it possible to expect a superior operation of the vehicle control system.

5. Other Modification Example

Figure 15:
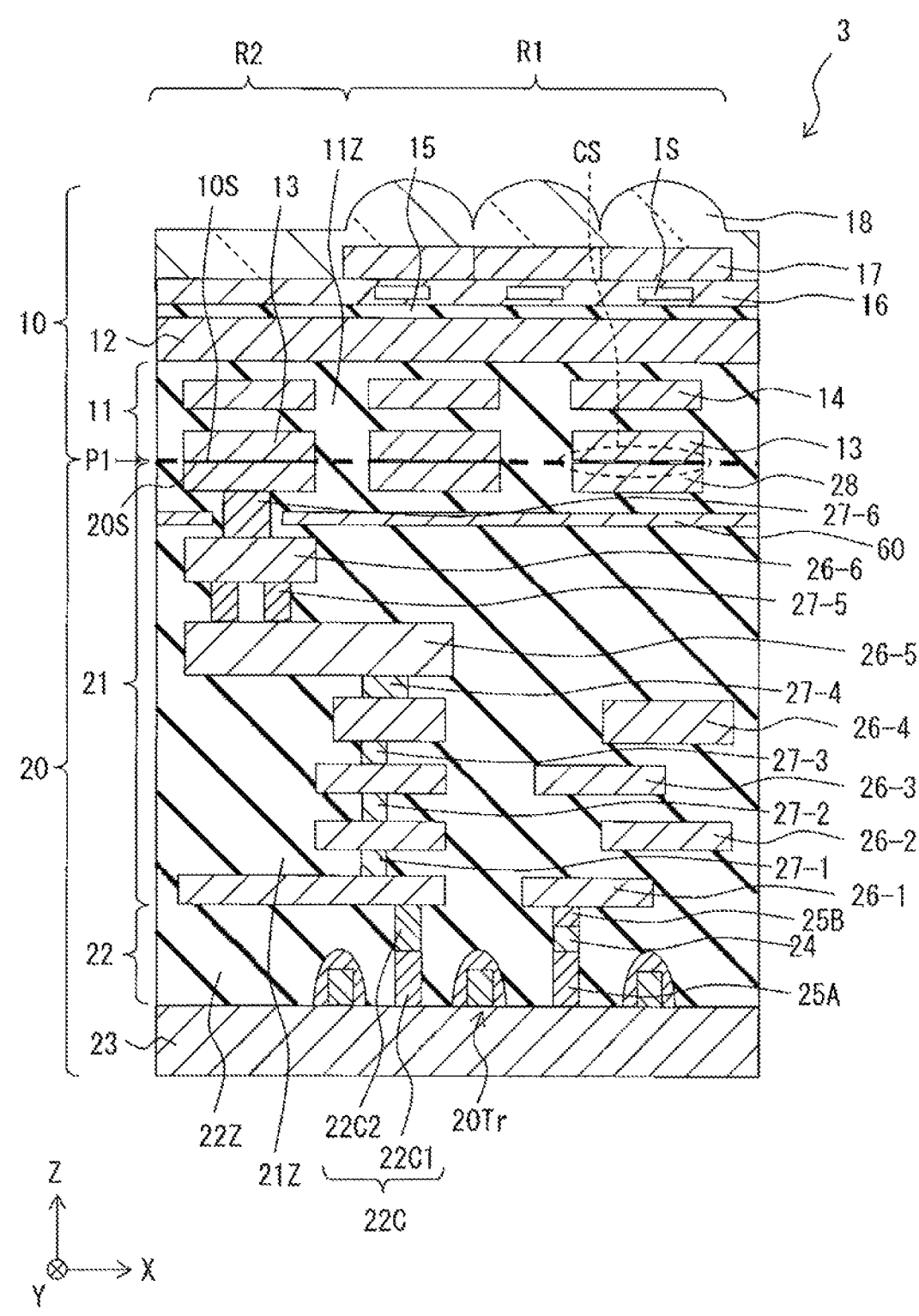
FIG. 15 is a cross-sectional view of an entire configuration example of an imaging device as a ninth modification example of the present disclosure.

Although the present disclosure has been described with reference to some embodiments and modification examples, the present disclosure is not limited to the embodiments and the like described above, and may be modified in a variety of ways. For example, as with an imaging device 3 illustrated in FIG. 15, an additional hydrogen block layer 60 may be further provided between the storage element 24 and the front surface 20S in the circuit substrate 20. FIG. 15 is a cross-sectional view of an entire configuration example of the imaging device 3 as a ninth modification example of the present disclosure. The imaging device 3 has substantially the same configuration as that of the imaging device 1 illustrated in FIG. 1 except for such a point. Further providing the additional hydrogen block layer 60 as with the imaging device 3 makes it possible to sufficiently prevent deterioration-causing materials such as a hydrogen gas generated in a manufacturing process of the imaging device 3 from reaching the storage element 24. It is to be noted that the additional hydrogen block layer 60 is desirably provided entirely over both the pixel region R1 and the peripheral region R2, but may be selectively provided in a partial region of the pixel region R1 and the peripheral region R2. In a case where the additional hydrogen block layer 60 is selectively provided in a partial region in the XY plane, it is sufficient if the additional hydrogen block layer 60 is provided at a position overlapping a storage element in the stacking direction (the Z-axis direction). In addition, the additional hydrogen block layer 60 may also serve as a portion of a wiring line.

Figure 16:
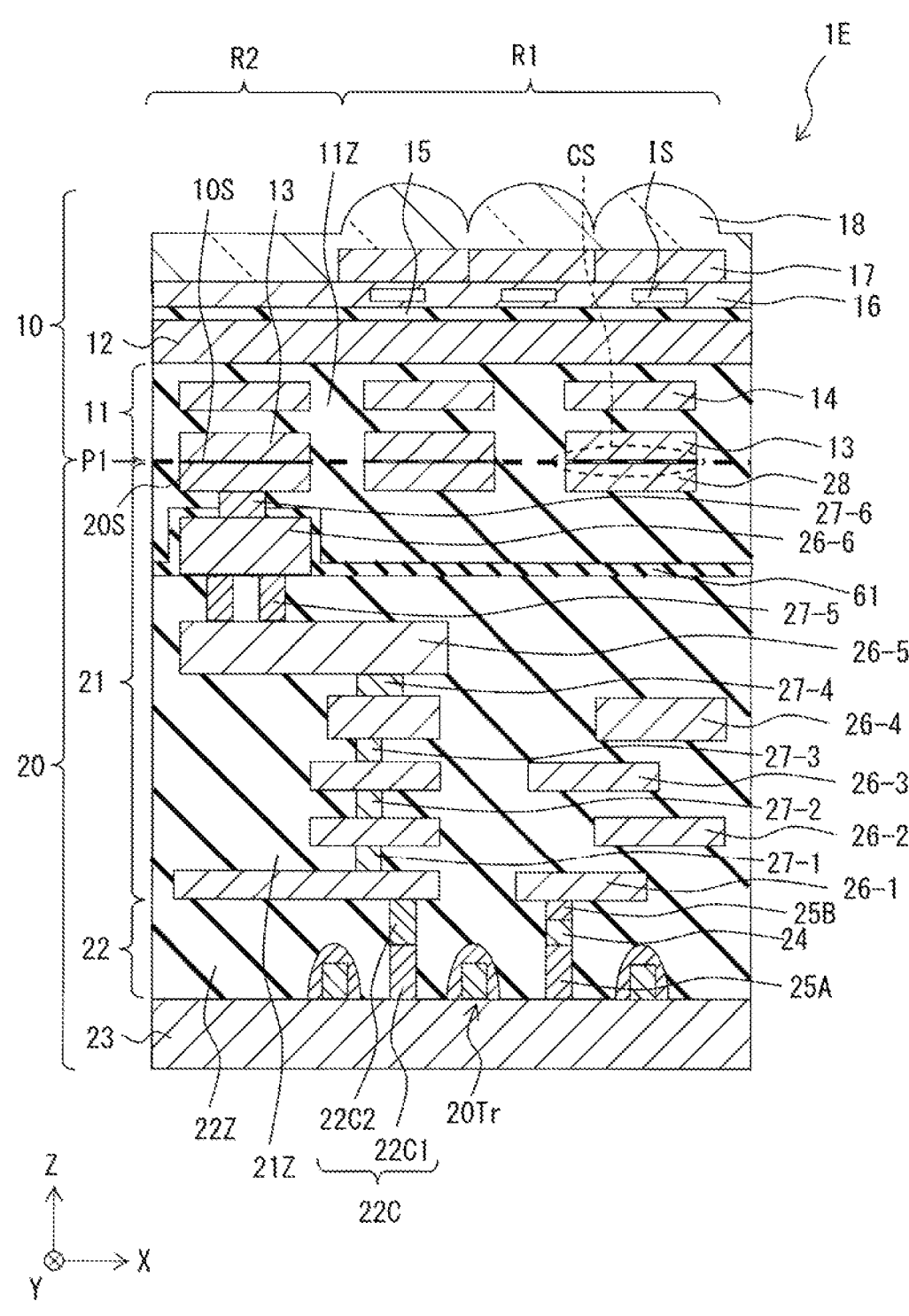
FIG. 16 is a cross-sectional view of an entire configuration example of an imaging device as a tenth modification example of the present disclosure.
Figure 17:
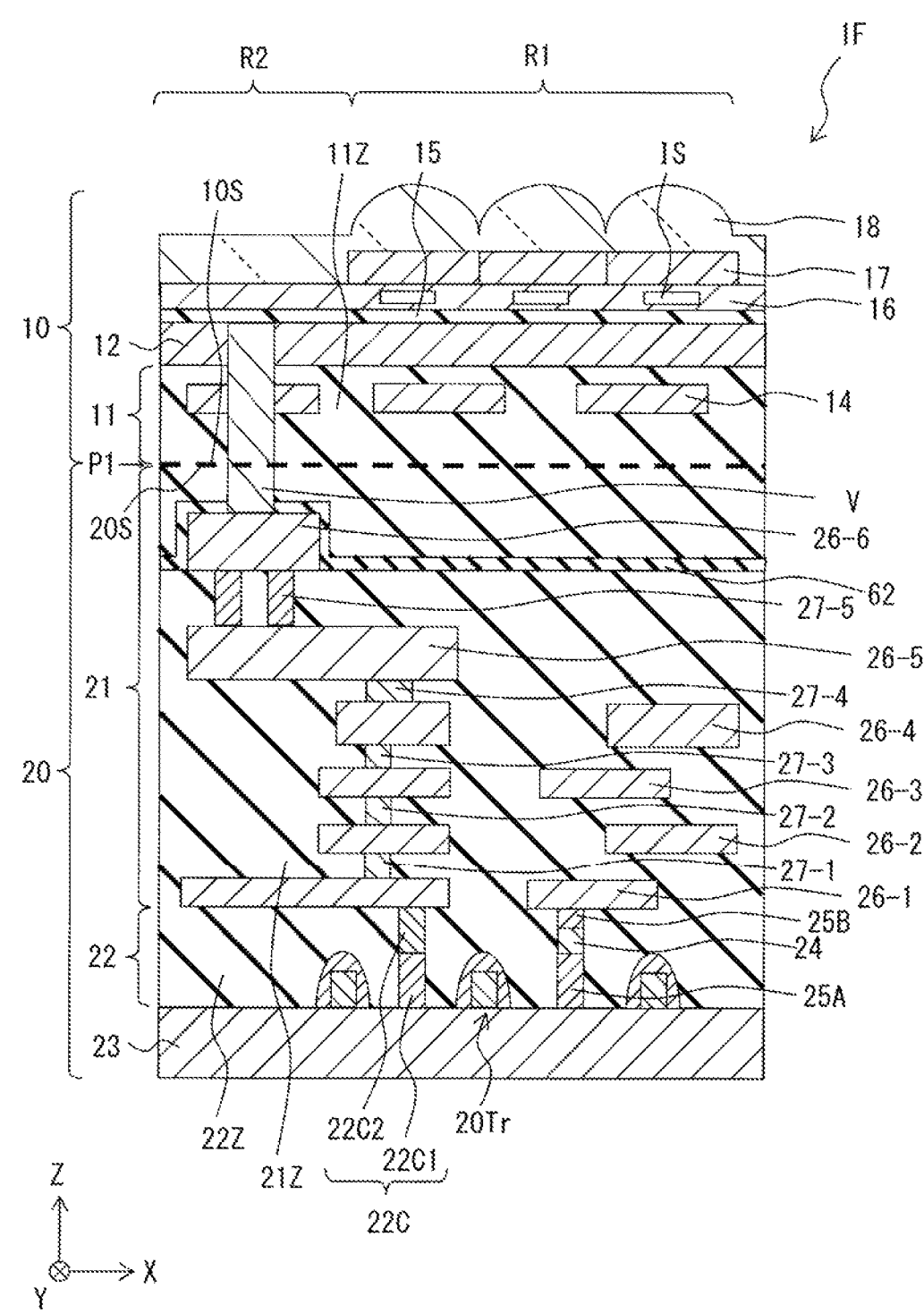
FIG. 17 is a cross-sectional view of an entire configuration example of an imaging device as an eleventh modification example of the present disclosure.
Figure 18:
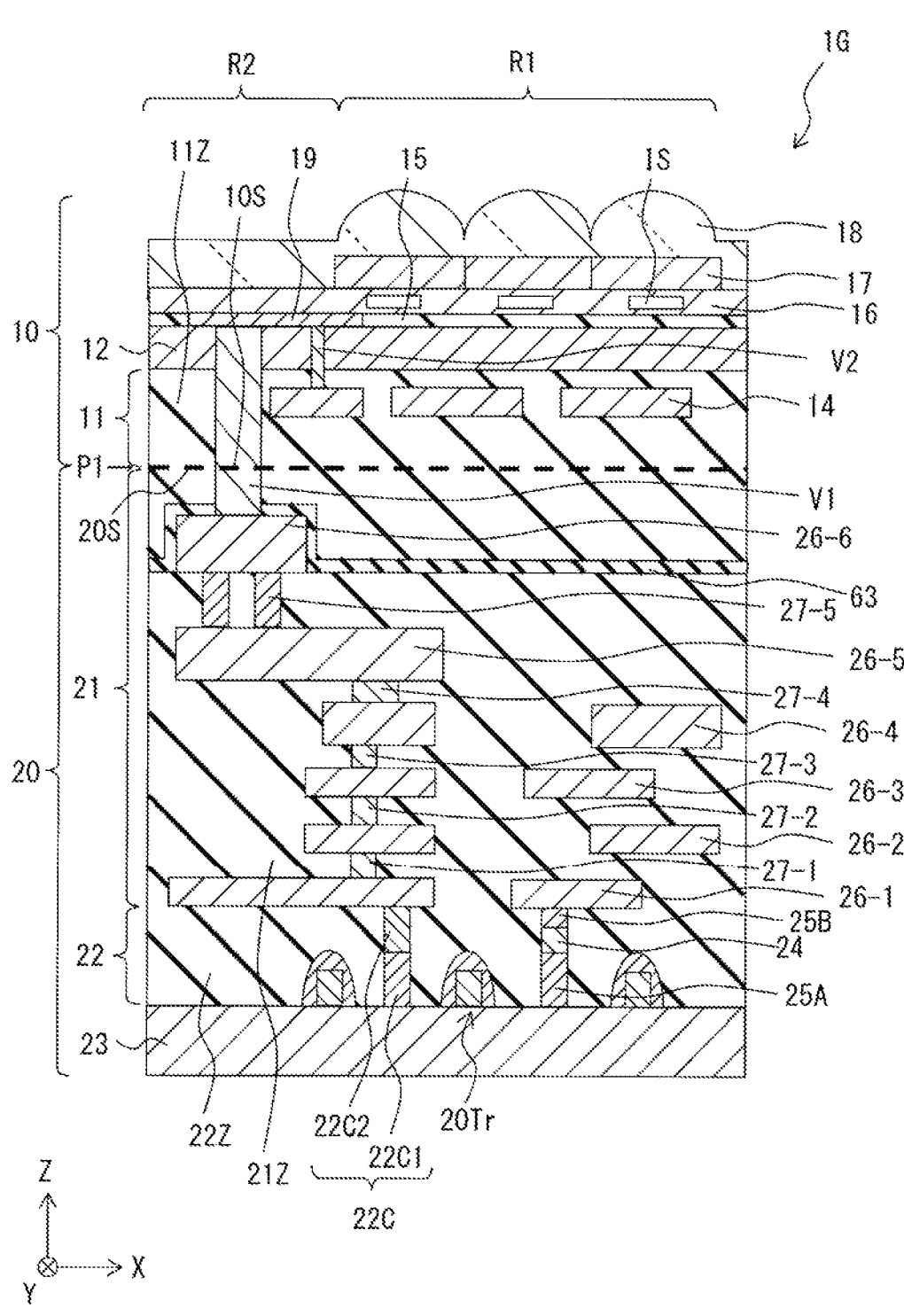
FIG. 18 is a cross-sectional view of an entire configuration example of an imaging device as a twelfth modification example of the present disclosure.
Figure 19:
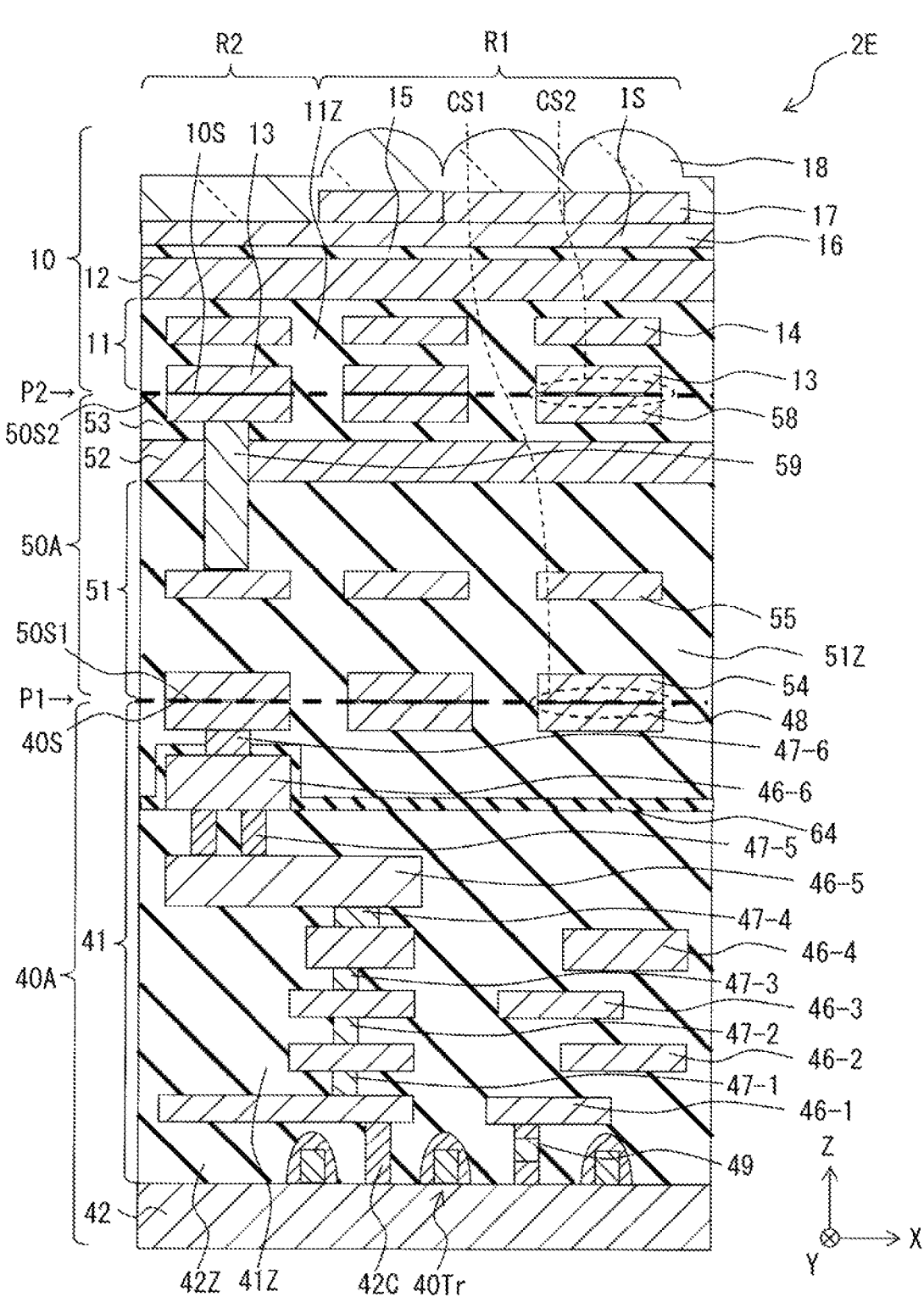
FIG. 19 is a cross-sectional view of an entire configuration example of an imaging device as a thirteenth modification example of the present disclosure.
Figure 20:
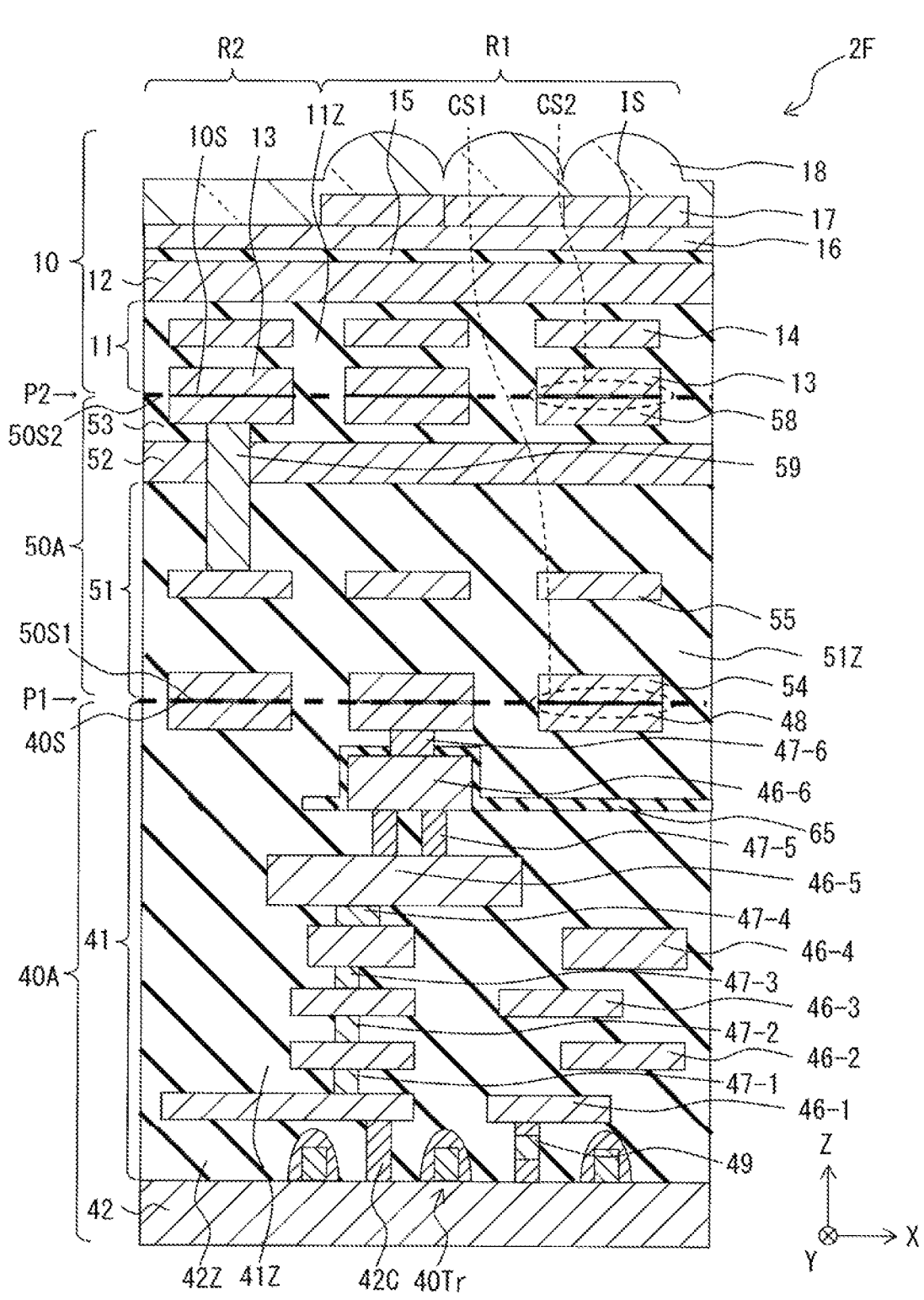
FIG. 20 is a cross-sectional view of an entire configuration example of an imaging device as a fourteenth modification example of the present disclosure.

In addition, in the present disclosure, for example, as with imaging devices 1E to 1G having a two-layer configuration including the circuit substrate 20 and the sensor substrate 10 illustrated in FIGS. 16 to 18, additional block layers 61 to 63 may be further respectively provided between the front surface 20S in the circuit substrate 20 and the wiring line 26-6 closest to the front surface 20S. FIGS. 16 to 18 are respectively cross-sectional views of entire configuration examples of the imaging devices 1E to 1G as tenth to twelfth modification examples of the present disclosure. The imaging devices 1E to 1G respectively have substantially the same configurations as those of the imaging devices 1, 1A, and 1B illustrated in FIGS. 1, 3, and 4, except that the additional block layers 61 to 63 are further provided. Likewise, for example, as with an imaging device 2E having a three-layer configuration including the logic substrate 40, the intermediate substrate 50, and the sensor substrate 10 illustrated in FIG. 19, an additional block layer 64 may be further provided between the front surface 40S in the logic substrate 40 and the wiring line 46-6 closest to the front surface 40S. FIG. 19 is a cross-sectional view of an entire configuration example of the imaging device 2E as a thirteenth modification example of the present disclosure. The imaging device 2E has substantially the same configuration as that of the imaging device 2D illustrated in FIG. 11, except that the additional block layer 64 is further provided. It is to be noted that aluminum (Al) is suitable as materials of the wiring line 26-6 and the wiring line 46-6. In addition, for example, SiN (silicon nitride) is suitable as materials of the additional block layers 61 to 64. Further, the additional block layers 61 to 64 desirably cover an entire region other than regions where the vias 27-6, V, V1, and 47-6 are formed in the XY plane. However, as with an imaging device 2F illustrated in FIG. 20, an additional block layer 65 may be provided only in the pixel region R1. FIG. 20 is a cross-sectional view of an entire configuration example of the imaging device 2F as a fourteenth modification example of the present disclosure.

Further providing the additional block layers 61 to 65 as with the imaging devices 1E to 1G, 2E, and 2F makes it possible to sufficiently prevent deterioration-causing materials such as a hydrogen gas generated in manufacturing processes of the imaging devices 1E to 1G, 2E, and 2F from reaching the storage element 24 or the storage element 49. In the imaging devices 1E to 1G, 2E, and 2F, the additional block layers 61 to 65 are respectively provided to partition, along the XY plane, the insulating layer 21Z as an interlayer insulating film covering surroundings of the wiring line 26-6 and the via 27-6. The insulating layer 21Z has a higher content rate of water, as compared with other portions. The water may become a generation source of a hydrogen gas, an oxygen gas, a hydrogen radical that are deterioration-causing materials having a possibility of causing deterioration in performance of the storage elements 24 and 49. Accordingly, providing the additional block layers 61 to 65 makes it possible to effectively protect the storage elements 24 and 49 from the deterioration-causing materials described above.

Figure 21:
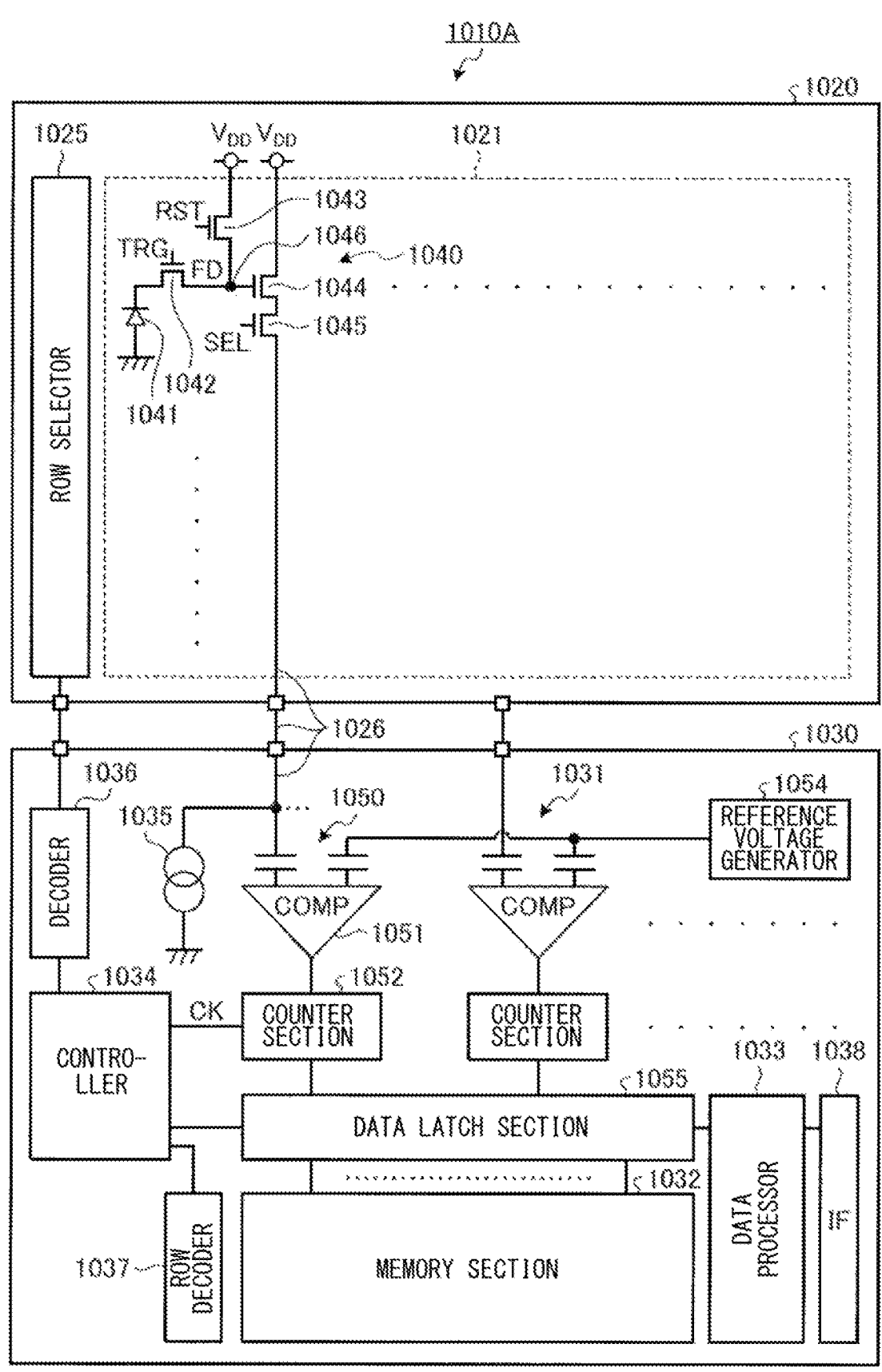
FIG. 21 is a block diagram illustrating a schematic configuration example of an imaging device as a fifteenth modification example of the present disclosure.

In addition, the semiconductor device according to the present disclosure is applicable to a solid-state imaging device 1010A illustrated in FIG. 21, for example.

The solid-state imaging device 1010A illustrated in FIG. 21 has a configuration in which a sensor substrate 1020 and a circuit substrate 1030 are stacked vertically. The semiconductor device according to the present disclosure is applicable as a semiconductor device included in a memory section 1032 illustrated in FIG. 21, for example.

The sensor substate 1020 illustrated in FIG. 21 includes, for example, a sensor section 1021 and a row selector 1025. The sensor section 1021 includes a plurality of sensors 1040 arranged in a matrix. The sensors 1040 each include, for example, a photodiode 1041, a transfer transistor (also called a transfer gate) 1042, a reset transistor 1043, an amplification transistor 1044, a selection transistor 1045, and a floating diffusion region section (FD) 1046. The row selector 1025 selects the respective sensors 1040 of the sensor section 1021 on a row-by-row basis on the basis of an address signal supplied from the circuit substrate 1030 side. It is to be noted that herein, the row selector 1025 is provided in the sensor substrate 1020, but it is possible to also provide the row selector 1025 in the circuit substrate 1030.

The circuit substrate 1030 illustrated in FIG. 21 includes, for example, a signal processor 1031, a memory section 1032, a data processor 1033, a controller 1034, a current source 1035, a decoder 1036, a row decoder 1037, an interface (IF) section 1038, and the like. In addition, a sensor driver (not illustrated) that drives the respective sensors 1040 of the sensor section 1021 is provided.

The signal processor 1031 may be configured to perform predetermined signal processing including digitization (AD conversion) in parallel (column parallel) in units of sensor columns with respect to analog signals read by each sensor row from the respective sensors 1040 of the sensor section 1021, for example. Then, the signal processor 1031 includes an analog-digital converter (AD converter) 1050 that digitizes the analog signals read from the respective sensors 1040 of the sensor section 1021 to signal lines 1026, and transfers AD-converted image data (digital data) to the memory section 1032.

The signal lines 1026 including a row control line for each sensor row and a column signal line (a vertical signal line) for each sensor column are wired with the sensor section 1021 including the sensors 1040 arranged in a matrix.

It is to be noted that the signal processor 1031 may further include a reference voltage generator 1054 that generates a reference voltage to be used for AD conversion in the AD converter 1050. The reference voltage generator 1054 may be configured using a DA converter (a digital-analog converter), but is not limited thereto.

The AD converter 1050 includes, for example, a comparator (comparator) 1051 and a counter section 1052. The comparator 1051 uses an analog signal read through the signal line 1026 from each sensor 1040 of the sensor section 1021 as a comparison input, and uses a reference voltage supplied from the reference voltage generator 1054 as a reference input, and compares the both inputs. For example, an up-down counter is used as the counter section 1052. The counter section 1052 is supplied with a clock CK at the same timing as a start timing of supply of the reference voltage to the comparator 1051. The counter section 1052, which is an up/down counter, performs down count or up count in synchronization with the clock CK to thereby measure a period of a pulse width of an output pulse of the comparator 1051, that is a comparison period from the start of a comparison operation to the end of the comparison operation. Then, a count result (count value) of the counter section 1052 becomes a digital value (image data) obtained by digitizing the analog signal.

A data latch section 1055 latches the image data digitized by the AD converter 1050. The memory section 1032 stores the image data having been subjected to the predetermined signal processing in the signal processor 1031. The data processor 1033 reads the image data stored in the memory section 1032 in predetermined order, and performs various kinds of processing on the image data, and outputs the image data to the outside of a chip through the interface (IF) 1038.

The controller 1034 controls respective operations of the sensor driver (not illustrated) and the signal processor 1031 such as the memory section 1032 and the data processor 1033 on the basis of a horizontal synchronization signal XHS, a vertical synchronization signal XVS, and a reference signal such as a master clock MCK that are provided from the outside of the chip, for example. At this time, the controller 1034 performs control while synchronizing circuits (such as the row selector 1025 and the sensor section 1021) on the sensor substrate 1020 side and the signal processor 1031 (such as the memory section 1032 and the data processor 1033) on the circuit substrate 1030 side.

The current source 1035 is coupled to the respective signal lines 1026 to which analog signals is read by each sensor column from the respective sensors 1040 of the sensor section 1021, for example. The current source 35 has a configuration of a so-called load MOS circuit including a MOS transistor in which a gate potential is biased to a constant potential to supply a certain constant current to the signal line 1026. The current source 1035 including the load MOS circuit supplies a constant current to the amplification transistor 1044 of the sensor 1040 included in a selected row to thereby operate the amplification transistor 1044 as a source follower.

In a case where respective sensors 1040 of the sensor section 1021 are selected on a row-by-row basis, under control of the controller 1034, the decoder 36 provides the row selector 1025 with an address signal designating the address of the selected row. The row decoder 1037 designates a row address in a case where image data is to be written to the memory section 1032 or is to be read from the memory section 1032, under control of the controller 1034.

The sensor substrate 1020 and the circuit substrate 1030 are electrically coupled to each other through a joint section such as a TSV (Through-Silicon Via) that penetrates a semiconductor substrate, for example. For coupling using the TSV, for example, it is possible to use a so-called Twin TSV system in which two TSVs, that is, a TSV provided in the sensor substrate 1020 and a TSV provided from the sensor substrate 1020 to the circuit substrate 1030 are coupled to each other outside a chip, and a so-called Shared TSV system in which the sensor substrate 1020 and the circuit substrate 1030 are coupled to each other by a TSV that penetrates from the sensor substrate 1020 to the circuit substrate 1030, or the like.

In addition, the sensor substrate 1020 and the circuit substrate 1030 are electrically coupled to each other through a joint section such as so-called metal bonding in which electrode pads formed on joining surfaces of the sensor substrate 1020 and the circuit substrate 1030 are adhered to each other, for example. At this time, the electrode pads are formed including metal such as copper, and the joint section is also referred to as Cu—Cu bonding. Alternatively, bump bonding or the like may be used for the joint section between the sensor substrate 1020 and the circuit substrate 1030.

In addition, in the embodiments and the like described above, the imaging device has been described as an example; however, the semiconductor device according to the present disclosure is not limited thereto.

It is to be noted that the effects described in the present specification are merely illustrative and non-limiting, and there may be other effects. In addition, the present technology may have the following configurations.

(1)

A semiconductor device including:

a first substrate having a first front surface; and a second substrate having a second front surface joined to the first front surface, the first substrate including a first wiring layer and a first semiconductor layer that are stacked in order from a position close to the second substrate, the first wiring layer including a first wiring line, and the second substrate including a storage element layer and a second semiconductor layer that are stacked in order from a position close to the first substrate, the storage element layer including a storage element.

(2)

The semiconductor device according to (1), in which the first substrate includes a first electrode that is exposed to the first front surface, and the second substrate includes a second electrode that is exposed to the first front surface and is joined to the first electrode.

(3)

The semiconductor device according to (1) or (2), in which the second substrate further includes a second wiring layer located on a side opposite to the second semiconductor layer as viewed from the storage element layer, the second wiring layer including a second wiring line.

(4)

The semiconductor device according to (3), in which the second substrate further includes:

a transistor that is provided between the storage element and the second semiconductor layer and includes a source electrode and a drain electrode, a first contact layer that couples the storage element and the source electrode or the drain electrode to each other, and a second contact layer that couples the storage element and the second wiring line to each other.

(5)

The semiconductor device according to (4), in which the second substrate further includes:

a protective film covering an end surface of the storage element, and a hydrogen block layer covering at least a portion of an outer surface of the protective film, and the storage element is sandwiched between the first contact layer and the second contract layer in a stacking direction of the first substrate and the second substrate.

(6)

The semiconductor device according to (5), in which the second substrate further includes:

a first terminal provided between the first contact layer and the storage element, and a second terminal provided between the second contact layer and the storage element, and a thickness of the second terminal is larger than a thickness of the first terminal.

(7)

The semiconductor device according to (6), in which the second terminal includes titanium.

(8)

The semiconductor device according to (6) or (7), in which a dimension in an in-plane direction of the second terminal is larger than a dimension in the in-plane direction of the storage element.

(9)

The semiconductor device according to any one of (5) to (8), in which the hydrogen block layer includes titanium.

(10)

The semiconductor device according to (9), in which the second contact layer is covered with a titanium-containing layer coupled to the hydrogen block layer.

(11)

The semiconductor device according to any one of (1) to (10), in which the first substrate further includes an imaging element provided on a side opposite to the first wiring layer as viewed from the first semiconductor layer.

(12)

The semiconductor device according to (11), in which the first substrate includes a first electrode that is exposed to the first front surface, and the second substrate includes a second electrode that is exposed to the first front surface and is joined to the first electrode.

(13)

The semiconductor device according to (12), in which the first substrate includes a pixel region in which a plurality of the imaging elements is arranged, and a peripheral region surrounding the pixel region, and a joint section between the first electrode and the second electrode is formed at a position overlapping the pixel region in a stacking direction of the first substrate and the second substrate.

(14)

The semiconductor device according to any one of (1) to (13), further including a third substrate that is provided on a side opposite to the first substrate as viewed from the second substrate, and has a third front surface joined to a second rear surface on a side opposite to the second front surface in the second substrate.

(15)

The semiconductor device according to any one of (1) to (13), further including a third substrate that is provided on a side opposite to the second substrate as viewed from the first substrate, and has a third front surface joined to a first rear surface on a side opposite to the first front surface in the first substrate.

(16)

The semiconductor device according to any one of (1) to (15), in which the second substrate further includes a hydrogen block layer between the storage element and the second front surface.

This application claims the benefit of Japanese Priority Patent Application JP2018-138609 filed with the Japan Patent Office on Jul. 24, 2018, the entire contents of which are incorporated herein by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor device, comprising:

a first substrate having a first front surface; and a second substrate having a second front surface joined to the first front surface, wherein the first substrate includes:

a first wiring layer and a first semiconductor layer that are stacked in order from a position close to the second substrate, wherein the first wiring layer includes a first wiring line, wherein the second substrate includes:

a storage element layer and a second semiconductor layer that are stacked in order from a position close to the first substrate, wherein the storage element layer includes a storage element;

a transistor;

a first contact layer in contact with the storage element;

a second contact layer that couples the storage element and the second substrate to each other;

a protective film covering an end surface of the storage element; and a hydrogen block layer covering at least a portion of an outer surface of the protective film, wherein the storage element is sandwiched between the first contact layer and the second contact layer in a stacking direction of the first substrate and the second substrate.

2. The semiconductor device according to claim 1, wherein the first substrate includes a first electrode that is exposed to the first front surface, and the second substrate includes a second electrode that is exposed to the first front surface and is joined to the first electrode.

3. The semiconductor device according to claim 1, wherein the second substrate further includes a second wiring layer located on a side opposite to the second semiconductor layer as viewed from the storage element layer, the second wiring layer including a second wiring line.

4. The semiconductor device according to claim 1, wherein the second substrate further includes:

a first terminal provided between the first contact layer and the storage element; and a second terminal provided between the second contact layer and the storage element, wherein a thickness of the second terminal is larger than a thickness of the first terminal.

5. The semiconductor device according to claim 4, wherein the second terminal includes titanium.

6. The semiconductor device according to claim 4, wherein a dimension in an in-plane direction of the second terminal is larger than a dimension in the in-plane direction of the storage element.

7. The semiconductor device according to claim 1, wherein the hydrogen block layer includes titanium.

8. The semiconductor device according to claim 7, wherein the second contact layer is covered with a titanium-containing layer coupled to the hydrogen block layer.

9. The semiconductor device according to claim 1, wherein the first substrate further includes an imaging element provided on a side opposite to the first wiring layer as viewed from the first semiconductor layer.

10. The semiconductor device according to claim 9, wherein the first substrate includes a first electrode that is exposed to the first front surface, and the second substrate includes a second electrode that is exposed to the first front surface and is joined to the first electrode.

11. The semiconductor device according to claim 10, wherein the first substrate includes a pixel region in which a plurality of the imaging elements is arranged, and a peripheral region surrounding the pixel region, and a joint section between the first electrode and the second electrode is formed at a position overlapping the pixel region in a stacking direction of the first substrate and the second substrate.

12. The semiconductor device according to claim 1, further comprising a third substrate that is provided on a side opposite to the first substrate as viewed from the second substrate, and has a third front surface joined to a second rear surface on a side opposite to the second front surface in the second substrate.

13. The semiconductor device according to claim 1, further comprising a third substrate that is provided on a side opposite to the second substrate as viewed from the first substrate, and has a third front surface joined to a first rear surface on a side opposite to the first front surface in the first substrate.

14. The semiconductor device according to claim 1, wherein the second substrate further includes a hydrogen block layer between the storage element and the second front surface.

15. An electronic apparatus, comprising:

an optical system;

a semiconductor device that receives light from the optical system, the semiconductor device including:

a first substrate having a first front surface; and a second substrate having a second front surface joined to the first front surface, wherein the first substrate includes:

a first wiring layer and a first semiconductor layer that are stacked in order from a position close to the second substrate, wherein the first wiring layer includes a first wiring line, wherein the second substrate includes:

a storage element layer and a second semiconductor layer that are stacked in order from a position close to the first substrate, wherein the storage element layer includes a storage element;

a transistor;

a first contact layer in contact with the storage element;

a second contact layer that couples the storage element and the second substrate to each other;

a protective film covering an end surface of the storage element; and a hydrogen block layer covering at least a portion of an outer surface of the protective film, wherein the storage element is sandwiched between the first contact layer and the second contact layer in a stacking direction of the first substrate and the second substrate; and a signal processor that processes signals received from the semiconductor device.

16. The electronic apparatus according to claim 15, wherein the second substrate further includes a second wiring layer located on a side opposite to the second semiconductor layer as viewed from the storage element layer, the second wiring layer including a second wiring line.

17. The electronic apparatus according to claim 15, wherein the first substrate includes a first electrode that is exposed to the first front surface, and the second substrate includes a second electrode that is exposed to the first front surface and is joined to the first electrode.

18. The electronic apparatus according to claim 15, wherein the first substrate further includes an imaging element provided on a side opposite to the first wiring layer as viewed from the first semiconductor layer.

19. The electronic apparatus according to claim 15, further comprising a third substrate that is provided on a side opposite to the first substrate as viewed from the second substrate, and has a third front surface joined to a second rear surface on a side opposite to the second front surface in the second substrate.

20. The electronic apparatus according to claim 15, further comprising a third substrate that is provided on a side opposite to the second substrate as viewed from the first substrate, and has a third front surface joined to a first rear surface on a side opposite to the first front surface in the first substrate.

* * * * *